United States Patent
Ong et al.

(10) Patent No.: US 10,302,696 B2
(45) Date of Patent: *May 28, 2019

(54) TESTING FUSE CONFIGURATIONS IN SEMICONDUCTOR DEVICES

(71) Applicant: Rambus Inc., Sunnyvale, CA (US)

(72) Inventors: Adrian E. Ong, Pleasanton, CA (US); Paul Fuller, Ketchum, ID (US); Nick van Heel, Eagle, ID (US); Mark Thomann, Boise, ID (US)

(73) Assignee: Rambus Inc., Sunnyvale, CA (US)

( * ) Notice: Subject to any disclaimer, the term of this patent is extended or adjusted under 35 U.S.C. 154(b) by 152 days.

This patent is subject to a terminal disclaimer.

(21) Appl. No.: 15/395,546

(22) Filed: Dec. 30, 2016

(65) Prior Publication Data

US 2017/0176533 A1      Jun. 22, 2017

Related U.S. Application Data

(60) Continuation of application No. 14/250,191, filed on Apr. 10, 2014, now Pat. No. 9,568,544, which is a continuation of application No. 13/206,434, filed on Aug. 9, 2011, now Pat. No. 8,717,052, which is a division of application No. 12/008,318, filed on Jan. 10, 2008, now Pat. No. 8,063,650, which is a continuation-in-part of application No. 11/472,016, filed on Jun. 20, 2006, now Pat. No. 7,466,160, which is a continuation-in-part of application No. 11/207,665, filed on Aug. 18, 2005, now Pat. No. 7,309,999, which is a continuation-in-part of application No. 11/108,385, filed on Apr. 18, 2005, now Pat. No. 7,259,582, which is a division of application No. 10/608,613, filed on Jun. 27, 2003, now Pat. No. 6,882,171, which is a
(Continued)

(51) Int. Cl.
  G01R 31/26      (2014.01)
  G01R 31/317     (2006.01)
  G01R 31/28      (2006.01)

(52) U.S. Cl.
  CPC .... *G01R 31/31722* (2013.01); *G01R 31/2851* (2013.01); *G01R 31/31723* (2013.01); *H01L 2224/05554* (2013.01); *H01L 2224/48137* (2013.01); *H01L 2224/48145* (2013.01)

(58) Field of Classification Search
  CPC .............. G01R 31/319; G01R 31/3172; G01R 31/31701; G01R 31/31723
  See application file for complete search history.

(56) References Cited

U.S. PATENT DOCUMENTS

| | | |
|---|---|---|
| 4,263,650 A | 4/1981 | Bennett et al. |
| 4,743,841 A | 5/1988 | Takeuchi |
| | (Continued) | |

FOREIGN PATENT DOCUMENTS

| | | |
|---|---|---|
| EP | 0312217 | 4/1989 |
| TW | 434560 | 5/2001 |
| TW | 544301 B | 8/2003 |

OTHER PUBLICATIONS

Ong, Adrian. "Integrated Circuit Testing Module Including Multiplexed Inputs" re U.S. Appl. No. 60/798,113, filed May 4, 2006, 21 pages.

*Primary Examiner* — Minh N Tang
(74) *Attorney, Agent, or Firm* — Lowenstein Sandler LLP

(57) ABSTRACT

Methods, systems, and apparatus for testing semiconductor devices.

20 Claims, 13 Drawing Sheets

Related U.S. Application Data continuation-in-part of application No. 10/305,635, filed on Nov. 27, 2002, now Pat. No. 6,812,726.

(56) References Cited

U.S. PATENT DOCUMENTS

| | | | |
|---|---|---|---|
| 4,773,028 | A | 9/1988 | Tallman |
| 4,825,414 | A | 4/1989 | Kawata |
| 4,873,669 | A | 10/1989 | Furutani et al. |
| 5,151,881 | A | 9/1992 | Kajigaya et al. |
| 5,177,594 | A | 1/1993 | Chance et al. |
| 5,251,095 | A | 10/1993 | Miller et al. |
| 5,258,648 | A | 11/1993 | Lin |
| 5,301,156 | A | 4/1994 | Talley |
| 5,326,428 | A | 7/1994 | Farnworth et al. |
| 5,327,013 | A | 7/1994 | Moore et al. |
| 5,355,283 | A | 10/1994 | Marrs et al. |
| 5,388,104 | A | 2/1995 | Shirotori et al. |
| 5,418,452 | A | 5/1995 | Pyle |
| 5,457,400 | A | 10/1995 | Ahmad et al. |
| 5,477,545 | A | 12/1995 | Huang |
| 5,479,105 | A | 12/1995 | Kim et al. |
| 5,506,499 | A | 4/1996 | Puar |
| 5,517,515 | A | 5/1996 | Spall et al. |
| 5,523,697 | A | 6/1996 | Farnworth et al. |
| 5,535,165 | A | 7/1996 | Davis et al. |
| 5,594,694 | A | 1/1997 | Roohparvar et al. |
| 5,604,432 | A | 2/1997 | Moore et al. |
| 5,619,461 | A | 4/1997 | Roohparvar |
| 5,657,284 | A | 8/1997 | Beffa |
| 5,677,885 | A | 10/1997 | Roohparvar |
| 5,703,400 | A | 12/1997 | Wojnarowski et al. |
| 5,717,245 | A | 2/1998 | Pedder |
| 5,719,438 | A | 2/1998 | Beilstein, Jr. et al. |
| 5,751,015 | A | 5/1998 | Corbett et al. |
| 5,751,987 | A | 5/1998 | Mahant-Shetti et al. |
| 5,770,477 | A | 6/1998 | Brandenburg |
| 5,801,452 | A | 9/1998 | Farnworth et al. |
| 5,805,609 | A | 9/1998 | Mote, Jr. |
| 5,807,762 | A | 9/1998 | Akram et al. |
| 5,825,697 | A | 10/1998 | Gilliam et al. |
| 5,825,782 | A | 10/1998 | Roohparvar |
| 5,840,417 | A | 11/1998 | Bolger |
| 5,854,534 | A | 12/1998 | Beilin et al. |
| 5,923,600 | A | 7/1999 | Momohara |
| 5,925,142 | A | 7/1999 | Read et al. |
| 5,936,260 | A | 8/1999 | Corbett et al. |
| 5,959,310 | A | 9/1999 | Akram et al. |
| 5,966,388 | A | 10/1999 | Wright et al. |
| 5,995,379 | A | 11/1999 | Kyougoku et al. |
| 6,011,720 | A | 1/2000 | Tanaka |
| 6,022,758 | A | 2/2000 | Badehi |
| 6,026,039 | A | 2/2000 | Kim et al. |
| 6,047,393 | A | 4/2000 | Yamada |
| 6,052,287 | A | 4/2000 | Palmer et al. |
| 6,069,483 | A | 5/2000 | Maxwell et al. |
| 6,072,326 | A | 6/2000 | Akram et al. |
| 6,087,676 | A | 7/2000 | Akram et al. |
| 6,100,708 | A | 8/2000 | Mizuta |
| 6,100,716 | A | 8/2000 | Adham et al. |
| 6,104,658 | A | 8/2000 | Lu |
| 6,137,167 | A | 10/2000 | Ahn et al. |
| 6,154,860 | A | 11/2000 | Wright et al. |
| 6,157,046 | A | 12/2000 | Corbett et al. |
| 6,182,253 | B1 | 1/2001 | Lawrence et al. |
| 6,188,232 | B1 | 2/2001 | Akram et al. |
| 6,191,603 | B1 | 2/2001 | Muradali et al. |
| 6,194,738 | B1 | 2/2001 | Debenham et al. |
| 6,205,082 | B1 | 3/2001 | Tomita et al. |
| 6,208,157 | B1 | 3/2001 | Akram et al. |
| 6,216,240 | B1 | 4/2001 | Won et al. |
| 6,216,241 | B1 | 4/2001 | Fenstermaker et al. |
| 6,221,753 | B1 | 4/2001 | Seyyedy |
| 6,243,839 | B1 | 6/2001 | Roohparvar |
| 6,243,840 | B1 | 6/2001 | Raad et al. |
| 6,263,463 | B1 | 7/2001 | Hashimoto |
| 6,274,937 | B1 | 8/2001 | Ahn et al. |
| 6,286,115 | B1 | 9/2001 | Stubbs |
| 6,294,839 | B1 | 9/2001 | Mess et al. |
| 6,298,001 | B1 | 10/2001 | Lee et al. |
| 6,300,782 | B1 | 10/2001 | Hembree et al. |
| 6,310,484 | B1 | 10/2001 | Akram et al. |
| 6,320,201 | B1 | 11/2001 | Corbett et al. |
| 6,351,681 | B1 | 2/2002 | Chih et al. |
| RE37,611 | E | 3/2002 | Roohparvar |
| 6,365,421 | B2 | 4/2002 | Debenham et al. |
| 6,366,487 | B1 | 4/2002 | Yeom |
| 6,370,661 | B1 | 4/2002 | Miner |
| 6,392,948 | B1 | 5/2002 | Lee |
| 6,395,565 | B1 | 5/2002 | Akram et al. |
| 6,396,291 | B1 | 5/2002 | Akram et al. |
| 6,407,566 | B1 | 6/2002 | Brunelle et al. |
| 6,441,479 | B1 | 8/2002 | Ahn et al. |
| 6,445,625 | B1 | 9/2002 | Abedifard |
| 6,456,099 | B1 | 9/2002 | Eldridge et al. |
| 6,457,141 | B1 | 9/2002 | Kim et al. |
| 6,470,484 | B1 | 10/2002 | Day et al. |
| 6,472,747 | B2 | 10/2002 | Bazarjani et al. |
| 6,483,760 | B2 | 11/2002 | Kang |
| 6,484,279 | B2 | 11/2002 | Akram |
| 6,492,727 | B2 | 12/2002 | Nishizawa et al. |
| 6,502,215 | B2 | 12/2002 | Read et al. |
| 6,507,885 | B2 | 1/2003 | Lakhani et al. |
| 6,519,171 | B2 | 2/2003 | Matsuzaki et al. |
| 6,519,725 | B1 | 2/2003 | Huisman |
| 6,530,887 | B1 | 3/2003 | Gilbert et al. |
| 6,531,339 | B2 | 3/2003 | King et al. |
| 6,643,434 | B2 | 11/2003 | Cayrefourcq et al. |
| 6,675,269 | B2 | 1/2004 | Miura et al. |
| 6,711,042 | B2 | 3/2004 | Ishikawa |
| 6,732,304 | B1 | 5/2004 | Ong |
| 6,762,486 | B2 | 7/2004 | Inoue et al. |
| 6,791,175 | B2 | 9/2004 | Matsuo et al. |
| 6,801,461 | B2 | 10/2004 | Hii et al. |
| 6,812,726 | B1 | 11/2004 | Ong |
| 6,825,683 | B1 | 11/2004 | Berndt et al. |
| 6,882,171 | B2 | 4/2005 | Ong |
| 6,967,397 | B2 | 11/2005 | Inoue et al. |
| 6,996,652 | B1 | 2/2006 | Ong |
| 6,996,745 | B1 | 2/2006 | Shaylor |
| 6,996,754 | B1 | 2/2006 | Lee |
| 7,006,940 | B1 | 2/2006 | Ong |
| 7,030,641 | B1 | 4/2006 | Tang et al. |
| 7,053,470 | B1 | 5/2006 | Sellers et al. |
| 7,061,263 | B1 | 6/2006 | Ong |
| 7,075,175 | B2 | 7/2006 | Kazi et al. |
| 7,133,798 | B1 | 11/2006 | Ong |
| 7,139,945 | B2 | 11/2006 | Ong |
| 7,149,135 | B2 | 12/2006 | Okuno |
| 7,240,254 | B2 | 7/2007 | Ong |
| 7,245,141 | B2 | 7/2007 | Ong |
| 7,259,582 | B2 | 8/2007 | Ong |
| 7,265,570 | B2 | 9/2007 | Ong |
| 7,269,524 | B1 | 9/2007 | Ong et al. |
| 7,269,765 | B1 | 9/2007 | Charlton et al. |
| 7,305,595 | B2 | 12/2007 | Goodwin et al. |
| 7,307,442 | B2 | 12/2007 | Ong |
| 7,309,999 | B2 | 12/2007 | Ong |
| 7,310,000 | B2 | 12/2007 | Ong |
| 7,313,740 | B2 | 12/2007 | Ong |
| 7,365,557 | B1 | 4/2008 | Ong |
| 7,370,256 | B2 | 5/2008 | Ong |
| 7,404,117 | B2 | 7/2008 | Ong et al. |
| 7,425,840 | B2 | 9/2008 | Jang |
| 7,443,188 | B2 | 10/2008 | Ong |
| 7,444,575 | B2 | 10/2008 | Ong |
| 7,446,551 | B1 | 11/2008 | Ong |
| 7,466,160 | B2 | 12/2008 | Ong et al. |
| 7,593,271 | B2 | 9/2009 | Ong |
| 7,673,193 | B1 | 3/2010 | Ong et al. |
| 7,745,920 | B2 | 6/2010 | Lee et al. |
| 7,779,311 | B2 | 8/2010 | Ong |
| 9,568,544 | B2* | 2/2017 | Ong ................ G01R 31/31722 |
| 2002/0017720 | A1 | 2/2002 | Nishizawa et al. |
| 2002/0105522 | A1 | 8/2002 | Kolluru et al. |

(56) References Cited

U.S. PATENT DOCUMENTS

| | | |
|---|---|---|
| 2002/0117729 A1 | 8/2002 | Aiki et al. |
| 2003/0235929 A1 | 12/2003 | Cowles et al. |
| 2004/0019841 A1 | 1/2004 | Ong |
| 2004/0027150 A1 | 2/2004 | Miura et al. |
| 2004/0100296 A1 | 5/2004 | Ong |
| 2004/0150089 A1 | 8/2004 | Inoue et al. |
| 2004/0196709 A1 | 10/2004 | Ong |
| 2004/0232559 A1 | 11/2004 | Adelmann |
| 2005/0024977 A1 | 2/2005 | Ong |
| 2005/0204223 A1 | 9/2005 | Ong |
| 2005/0236703 A1 | 10/2005 | Kazi et al. |
| 2005/0289428 A1 | 12/2005 | Ong |
| 2006/0152241 A1 | 7/2006 | Ong |
| 2006/0294440 A1 | 12/2006 | Riley |
| 2007/0053236 A1 | 3/2007 | Vogelsang |
| 2007/0067687 A1 | 3/2007 | Ong |
| 2007/0079204 A1 | 4/2007 | Ong |
| 2007/0108998 A1 | 5/2007 | Ito et al. |
| 2007/0262463 A1 * | 11/2007 | Akram ................. G01R 1/0483 257/774 |
| 2008/0088330 A1 * | 4/2008 | Mei ........................ G01R 35/00 324/750.16 |

\* cited by examiner

TESTING FUSE CONFIGURATIONS IN SEMICONDUCTOR DEVICES

CROSS-REFERENCE TO RELATED APPLICATIONS

This application is a continuation of application Ser. No. 14/250,191, filed on Apr. 10, 2014, now U.S. Pat. No. 9,568,544, issued Feb. 14, 2017, which is a continuation of application Ser. No. 13/206,434, filed on Aug. 9, 2011, now U.S. Pat. No. 8,717,052, issued May 6, 2014, which is a divisional of application Ser. No. 12/008,318, filed on Jan. 10, 2008, now U.S. Pat. No. 8,063,650, issued Nov. 22, 2011, which is a continuation in part of application Ser. No. 11/472,016, filed on Jun. 20, 2006, now U.S. Pat. No. 7,466,160, issued Dec. 16, 2008, which is a continuation in part of application Ser. No. 11/207,665, filed on Aug. 18, 2005, now U.S. Pat. No. 7,309,999, issued Dec. 18, 2007, which is a continuation in part of application Ser. No. 11/108,385, filed on Apr. 18, 2005, now U.S. Pat. No. 7,259,582, issued Aug. 21, 2007, which is a division of application Ser. No. 10/608,613, filed on Jun. 27, 2003, now U.S. Pat. No. 6,882,171, issued Apr. 19, 2005, which is a continuation in part of application Ser. No. 10/305,635, filed on Nov. 27, 2002, now U.S. Pat. No. 6,812,726, issued Nov. 2, 2004. The disclosures of all the above patents and patent applications are hereby incorporated by reference.

BACKGROUND

The present invention relates to semiconductor devices, and in particular, testing fuse configurations in semiconductor devices.

A semiconductor device includes one or more integrated circuit (IC) devices, each of which includes many miniaturized circuits implemented in a single semiconductor substrate, commonly referred to as a "chip." The IC devices are typically tested before they are used in order to ensure their proper operation. The IC devices can be tested in a limited fashion using built-in self test (BIST) circuitry that is implemented within the IC devices themselves. BIST testing however, is often incomplete and does not test all aspects of the device operation. Thorough testing of an IC device is traditionally accomplished with complex external testing equipment that typically requires many dedicated input/output (I/O) leads for allowing the test equipment to input various test patterns, codes, and data, and to stress the circuitry of the IC device. The use of the external testing equipment can be particularly difficult if multiple IC devices are combined within a single package that has a limited number of input/output leads, and a thorough test is required for one or more of the devices within the package.

Some IC devices include fuses that can be selectively and permanently "blown," for example, by laser to optimize or fine tune certain electric or other operational parameters of particular device elements such as voltage regulators or delay elements. To find the optimal values of those electric or other operational parameters, such IC devices are traditionally tested for multiple fuse configurations in which different fuses are blown. Because the fuses are permanently blown in each of the different configurations, the traditional test requires different IC devices to implement different fuse configurations.

SUMMARY

An IC device includes one or more fuses and, for each fuse, a respective "soft-blow" circuit that can be programmed to simulate electric conditions in which the corresponding fuse is blown. By appropriately programming the soft-blow circuits, multiple fuse configurations can be tested in the same IC device without permanently blowing any of the fuses. Once the optimal fuse configuration has been found, the corresponding fuses can be permanently blown, for example, by laser.

In general, in one aspect, the present invention provides a semiconductor device that includes one or more external terminals configured to receive fuse configuration data from an external source. The semiconductor device also includes a soft-blow circuit to generate a soft-blow signal based on the fuse configuration data, and a fuse circuit that includes a fuse and has first and second operational states corresponding to the fuse being intact and blown, respectively. The fuse circuit is configured to receive the soft-blow signal and to select its operational state to be the first or second operational state based on the received soft-blow signal.

Particular implementations can include one or more of the following features. The soft-blow circuit can include a latch to receive and hold a portion of the fuse configuration data. The semiconductor device can also include one or more external terminals that are configured to receive mode selection signals to select between a test mode and a normal mode of operation for the device. Generating the soft-blow signal can be enabled in the test mode and disabled in the normal mode. Receiving the fuse configuration data can be disabled in the normal mode. The mode selection signals can define a programming phase of the test mode, and receiving the fuse configuration data can be enabled only during the programming phase. The soft-blow circuit can receive a data enable signal that enables receiving the fuse configuration data. The fuse circuit can generate an output signal that is different in the first operational state from that in the second operational state. The semiconductor device can also include a voltage generator coupled to the fuse circuit to generate a reference voltage that is different in the first operational state of the fuse circuit from that in the second operational state. Alternatively or in addition, the semiconductor device can include a delay element coupled to the fuse circuit and configured to receive an input signal and to output a delayed signal following the input signal by a time delay that is different in the first operational state of the fuse circuit from that in the second operational state. The fuse circuit can be configured (i) to generate an internal fuse signal based on the fuse being intact or blown, (ii) to combine the internal fuse signal and the received soft-blow signal, and (iii) to select its operational state to be the first or second operational state based on the combined signal. The fuse circuit can include one or more additional fuses and have additional operational states that correspond to one or more of the additional fuses being blown, and wherein the soft-blow circuit generates one or more additional soft-blow signals based on the fuse configuration data, and wherein the fuse circuit is configured to select its operational state to be one of the additional operational states based on the additional soft-blow signals. The soft-blow circuit can receive the fuse configuration data on parallel data lines, and each data line can correspond to a respective fuse in the fuse circuit. Or, the soft-blow circuit can receive the fuse configuration data for two or more fuses using a serial communication line.

In general, in another aspect, the present invention provides an integrated circuit device packaged in a semiconductor device package. The integrated circuit device includes one or more external terminals configured to receive mode selection signals selecting between a test mode and a normal mode of operation for the device, and one or more external terminals configured in the test mode to receive fuse configuration data from an external source. The device also includes a latch array and a fuse array circuit. The latch array includes a plurality of latches each of which being configured in the test mode to receive a corresponding data portion of the fuse configuration data and to output a respective soft-blow signal based on the received data portion. The fuse array circuit includes a plurality of fuses and generates a respective output signal for each fuse based on whether that fuse is blown or not, wherein each latch in the latch array corresponds to a respective fuse in the fuse array circuits, and in the test mode the fuse array circuit receives the respective soft-blow signal from each latch and generates the respective output signal for that fuse based on the received soft-blow signal.

Particular implementations can include one or more of the following features. The device can include a circuit element that receives one or more of the output signals from the fuse array circuit and selects its operational state based on the received output signals. The circuit element can include a voltage regulator providing a reference voltage whose value depends on the output signals from the fuse array circuit. Or the circuit element can include a delay element configured to receive an input signal and to output a delayed signal following the input signal by a time delay whose value depends on the output signals from the fuse array circuit.

In general, in yet another aspect, the present invention provides a method for operating a semiconductor device in a semiconductor device package. The method includes receiving fuse configuration data from an external source, generating a soft-blow signal based on the received fuse configuration data, receiving the soft-blow signal in a fuse circuit that includes a fuse and has first and second operational states corresponding to the fuse being intact and blown, respectively, and selecting the fuse circuit's operational state to be the first or second operational state based on the received soft-blow signal.

Particular implementations can include one or more of the following features. The method can include generating a tune signal in accordance with the fuse circuit's operational state, and transmitting the tune signal to a circuit element to tune operational parameters of that circuit element, wherein the circuit element can include a voltage regulator or a signal delay element.

In general, in yet another aspect, the present invention provides a method for testing semiconductor devices. The method includes putting a semiconductor device into a test mode, wherein the semiconductor device includes a set of fuses, and testing the semiconductor device for a plurality of fuse configurations without permanently blowing the fuses, wherein each fuse configuration corresponds to a respective subset of blown fuses within the set of fuses.

Particular implementations can include one or more of the following features. Testing the semiconductor device for a plurality of fuse configurations can include, for each fuse configuration, loading fuse configuration data into a soft-blow circuit of the semiconductor device, wherein the fuse configuration data defines the respective subset of blown fuses within the set of fuses. Operational parameters can be measured in each fuse configuration, and an optimal fuse configuration can be determined based on the measured operational parameters.

Particular embodiments can be implemented to realize one or more of the following advantages. An IC device can include soft-blow circuits that can be programmed to test a large number of different fuse configurations. Thus, an optimal fuse configuration can be found without permanently blowing the fuses. The optimal fuse configuration can be found without using and, after the test, discarding many IC devices. Using a single IC device for the test can also decrease inaccuracies resulting from the potentially different set-up for the many IC devices. A software program can test many different (potentially all) combinations and permutations of "blown" fuses on a single die in one probe touch down. Based on the test results, the appropriate fuse configuration can be selected to obtain a desired result. Such "soft blow" tests eliminate the need of physically blowing each fuse on a die and using multiple dice for the different fuse configurations. The "soft-blow" techniques can be used to characterize different combinations and permutations of the fuse configurations on each die that is from the same wafer but at different locations on that wafer; thus one can record or study deviations from the optimal "uniformness" of the wafer process. Based on such deviation record, the actual fuses can be blown selectively based on their location on the wafer to give uniform results for each die on the wafer. Thus, each die can be adjusted to behave substantially the same way (e.g., to achieve uniform voltage outputs or timing specifications) by adjusting internal voltage levels and delay elements. The soft-fuse techniques can also be used to adjust setup and hold times, timing skews, jitter (e.g., in DLL circuits), output drive strengths, oscillator frequencies (e.g., to control self-refresh period), voltage biasing and regulation circuits. The soft-fuse techniques can be implemented "on the fly" during production. Such on-the-fly soft-fuse testing can be implemented with relatively small impact to the through-put of the production. Further technical advantages are readily apparent to one skilled in the art from the following figures, descriptions, and claims.

BRIEF DESCRIPTION OF THE DRAWINGS

Like numerals are used for like and corresponding parts in the various drawings.

DETAILED DESCRIPTION

Figure 1A:
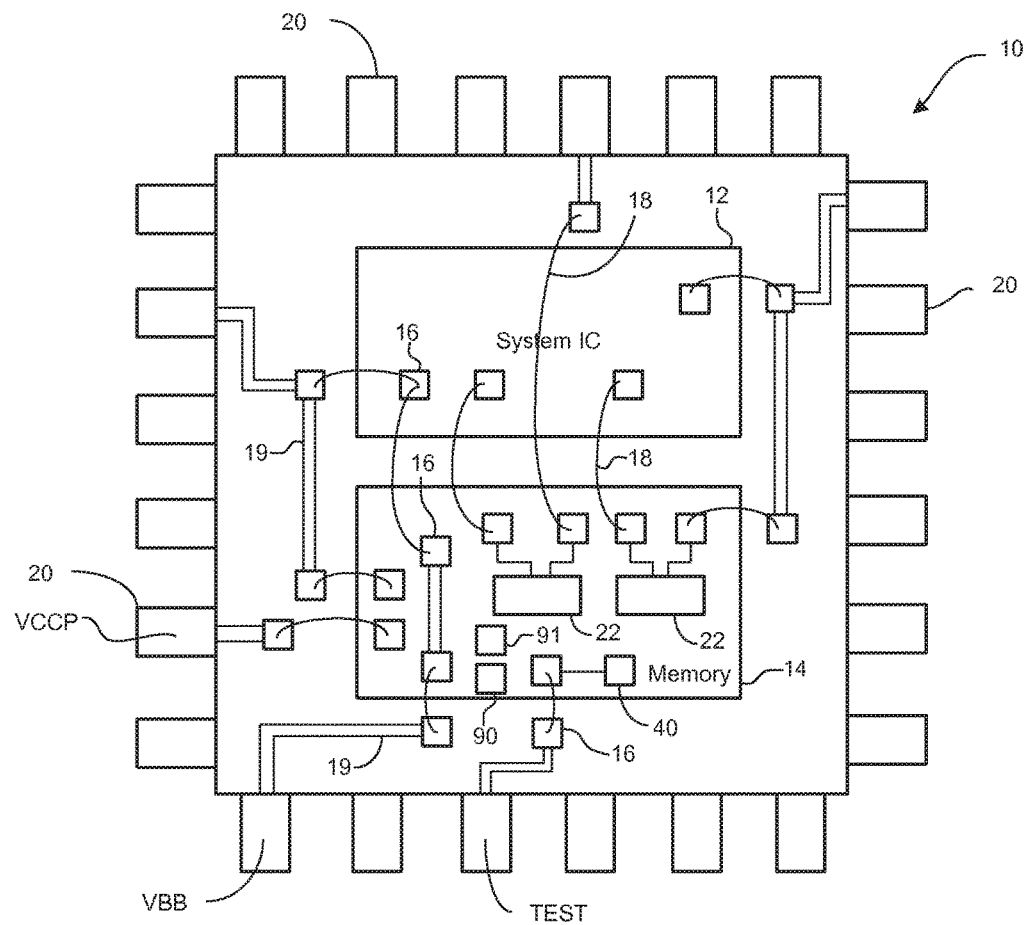
FIGS. 1A and 1B are schematic block diagrams illustrating exemplary semiconductor devices in which the present invention can be implemented.
Figure 1B:
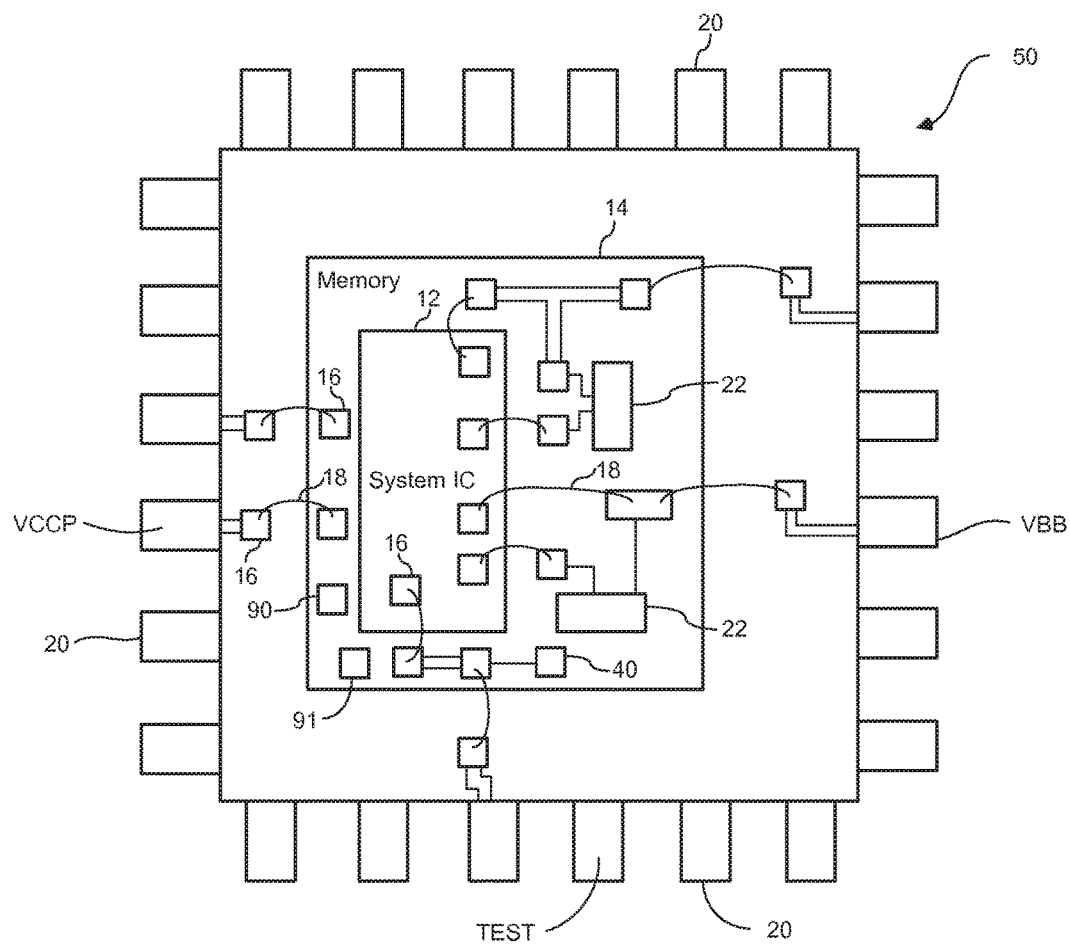

FIGS. 1A and 1B illustrate exemplary semiconductor devices 10 and 50 in which systems and methods according to various implementations of the invention can be implemented and used. The semiconductor devices 10 and 50 include a fuse circuit 91 and a corresponding soft-blow ("SB") circuit 90. The fuse circuit 91 includes one or more fuses that can be permanently blown, for example, by laser. The semiconductor devices 10 and 50 have a test mode in which the soft-blow circuit 90 and fuse circuit 91 can be configured to simulate electric and other operational conditions which are present when selected fuses are blown in the fuse circuit 91. Thus different fuse configurations can be tested and an optimal fuse configuration can be identified in the semiconductor devices 10 and 50 without permanently blowing any of the fuses in the fuse circuit 91. Once the optimal fuse configuration has been found, the fuses can be permanently blown, for example, by a laser beam.

Semiconductor devices 10 and 50 are packaged devices each of which can include one or more integrated circuit (IC) devices of any type. Within the packages, the IC devices may require testing, such as tests for finding optimal fuse configurations. The tests can be performed, for example, by external automated test equipment or an integrated circuit tester. Each of semiconductor devices 10 and 50 can be packaged as a standard ball grid array (BGA) or thin quad flatpack (TQFP) having 144 pins or more. However, other types of packaging may also be used. For example, the packaging may have a ceramic base with wire bonding or employing thin film substrates, and mounting on a silicon substrate or a printed circuit board (PCB) substrate. The packaging may further utilize various surface mount technologies such as a single in-line package (SIP), dual in-line package (DIP), zig-zag in-line package (ZIP), plastic leaded chip carrier (PLCC), small outline package (SOP), thin SOP (TSOP), flatpack, and quad flatpack (QFP), to name but a few, and utilizing various leads (e.g., J-lead, gull-wing lead) or BGA type connectors.

FIG. 1A is a block diagram of the exemplary semiconductor device 10. As depicted, semiconductor device 10 may comprise a system integrated circuit (IC) 12 and a memory 14. Each of system IC 12 and memory 14 can be implemented in a separate semiconductor die (commonly referred to as a "chip"), which is a monolithic structure formed from, for example, silicon or other suitable material. Accordingly, semiconductor device 10 can be referred to as a "multi-chip module" (MCM).

System IC 12 can be a chip with logic circuitry, such as, for example, an application specific integrated circuit (ASIC), a processor, a microprocessor, a microcontroller, a field programmable gate array (FPGA), programmable logic device (PLD), complex programmable logic device (CPLD), or other logic device. Memory 14 can be an IC memory chip, such as, for example, static random access memory (SRAM), dynamic random access memory (DRAM), synchronous DRAM (SDRAM), non-volatile random access memory (NVRAM), and read only memory (ROM), such as erasable programmable ROM (EPROM), electrically erasable programmable ROM (EEPROM), and flash memory.

System IC 12 and memory 14 may work in conjunction. Memory 14 provides storage capability for data/information that is provided from system IC 12 or some other components. System IC 12 provides processing capability for operating on data/information, and may retrieve information from and store information into memory 14. In a normal operation of the semiconductor device 10, signals for data/information may be received by memory 14 from system IC 12.

System IC 12 and memory 14 may each comprise one or more bonding pads 16, which can be connected via, for example, bonding wires 18, to provide communication between the chips and/or other components within or external to semiconductor device 10. As used herein, the terms "connected," "coupled," or any variant thereof, means any connection or coupling, either direct or indirect, between two or more elements. For clarity, in FIG. 1A, only a portion of the bonding pads 16 and bonding wires 18 are provided with reference numerals. At least some of the bonding pads 16 and bonding wires 18 may support communication directly between system IC 12 and memory 14.

In one implementation, memory 14 includes fuse circuit 91 and corresponding soft-blow circuit 90. Alternatively or in addition, system IC 14 can also include a fuse circuit and a corresponding soft-blow circuit. In other implementations, the fuse circuit 91 and the corresponding soft-blow circuit 90 can be implemented in the semiconductor device 10 or 50 separately from system IC 12 and memory 14.

In one embodiment, system IC 12 and memory 14 may be mounted in a side-by-side arrangement on a printed circuit board (PCB) substrate, such as for a multi-chip package (MCP). Such PCB substrate may also have bonding pads 16 and traces 19. In one embodiment, at least some traces 19 formed on either memory 14 or system IC 12 may be used for pin-out for the other chip.

As shown, semiconductor device 10 includes a number of external terminals 20 which can be, for example, input/output (I/O) leads or pins. For clarity, in FIG. 1A, only some of the external terminals 20 are provided with reference numerals. In general, these external terminals 20 enable the components within semiconductor device 10 to exchange data/information with components external to device 10. In one embodiment, one or more of these external terminals 16 may be connected to and serve both the system IC 12 and memory 14. That is, a terminal 20 which provides I/O capability for the system IC 12 may also provide I/O capability for memory 14.

To verify that semiconductor device 10 is operating properly, the components contained therein should be thoroughly tested. For example, semiconductor device 10 can be tested for identifying optimal configuration for the fuses in fuse circuit 91. For the fuse test, soft-blow circuit 90 and fuse circuit 91 can be programmed to simulate different configurations of blown fuses, without permanently blowing any of the fuses. Other components of semiconductor device 10 can also be tested.

In one embodiment, memory 14 may receive signals from test equipment (not shown) that is external to device 10. One or more test buffer multiplexer circuits 22 may be provided or incorporated in memory 14. Each multiplexer circuit 22 generally functions to multiplex between signals that are generated in normal operation of semiconductor device 10 and signals that are generated for testing of semiconductor device 10. The signals generated in normal operation may originate from system IC 12, whereas the signals for testing may originate from external test equipment.

Memory 14 may also comprise an on-chip sequence pattern generator, such as that described in related U.S. patent application Ser. No. 10/205,883 entitled "Internally Generating Patterns For Testing In An Integrated Circuit Device," filed on Jul. 25, 2002, assigned to the same assignee and incorporated by reference herein in its entirety. Such pattern generator may comprise a test column address counter and a test row address counter. The test column address counter may increment independently of the test row address counter. The address counters may function to internally generate sequences of numbers for use as addresses during testing.

If memory 14 were packaged as a discrete component (i.e., separate from system IC 12), thorough testing of the memory would require full access to all data, control, and access points of memory 14 so that complete test patterns could be input and extracted from the memory. But since memory 14 is packaged with system IC 12 in semiconductor device 10 and various access points of memory 14 are connected to system IC 12 for normal operation, test buffer multiplexer circuits 22 enable full access to memory 14 by multiplexing between signals from system IC 12 in normal operation and signals from external test equipment during testing. In this way, the external terminals 20 which are shared between the memory 14 and system IC 12 can imitate test pins which would be dedicated if memory 14 were packaged separately.

In one embodiment, the signals which are multiplexed can be clock enable (CKE), chip select (CS), row address strobe (RAS), column address strobe (CAS), write enable (WE), data read/write mask (DQM), bank select (BA), all row precharge (AP), bi-directional test data I/O (TD), set (SET), and load (LOAD), and respective testing counterparts for the same. It should be understood that, in other embodiments, signals in addition to or other than one or more of those described immediately above may be multiplexed.

In addition, one or more external terminals 20 may be dedicated (i.e., not shared between system IC 12 and memory 14) for the testing of memory 14. In one embodiment, these dedicated terminals 20 can receive signals for test (TEST), analog word-line voltage (VCCP), and analog memory substrate voltage (VBB). The TEST signal generally functions to put memory 14 in a test mode. The VCCP and VBB signals are used for stressing the memory 14 by providing voltage levels significantly above or below VDD and VSS. In another embodiment, only one external terminal 20—i.e., the one for the TEST signal—is dedicated for the testing of memory 14, and the signals for VCCP and VBB are generated internally within memory 14. This reduces pin count for the semiconductor device 10. In yet another embodiment, the external terminal which receives the TEST signal may be shared between the memory 14 and system IC 12. In such case, a voltage level which differs from the voltage levels used in normal operation is applied to the external terminal to put the memory 14 into test mode, as discussed herein in more detail.

Semiconductor device 10 can work in normal operation or be placed in test mode. In normal operation, system IC 12 and memory 14 may cooperate to receive, process, store, and output data and information. In test mode, one or both of system IC 12 and memory 14 may be functionally tested to verify proper operation. With embodiments of the present invention, memory 14 can be tested completely separately from system IC 12.

In one embodiment, semiconductor device 10 (and in particular, memory 14) can be placed in test mode with various control signals, such as, for example, the TEST, SET and LOAD signals. Memory 14 may include a test input control buffer circuit 40, which generally functions to receive and buffer control signals for programming the memory 14. In some embodiments, the TEST signal is made a high value (or "1", such as VDD) and remains high throughout in-package testing. The SET and LOAD signals are initially at a low value (or "0", such as GND). Then the SET and LOAD signals are pulsed high for predetermined periods (e.g., 10 ns) to enable test buffer multiplexer circuits 22 on memory 14. The device 10 is now in test mode.

In test mode, there may be two phases: a programming phase and an access phase. In the programming phase, the memory 14 can be set up or programmed for testing. This set up can include, for example, loading test addresses and sequential test data patterns (or codes) into various parts of the memory 14 (e.g., row and column test counters). The set up can also include programming of the soft-blow circuit 90. In one embodiment, one or more test data (TDQ) signals may be used to program test modes, load test addresses, load test vectors, and load test patterns. The SET and LOAD signals can be used to enable test addresses or vectors to be set and loaded. An exemplary timing diagram illustrating the pulses for SET and LOAD signals to program a code in memory 14 is shown and described with reference to FIG. 8 below. All test mode programming can be performed asynchronously (i.e., no clock is required). In one embodiment, a test control (TCNT) is set to a high value ("1") to cause the memory 14 to exit the programming phase and enter the access phase. New test addresses and vectors can no longer be programmed.

In the access phase, the memory 14 is actually operated using the test addresses and test patterns. In one embodiment, all external and burst counter addresses are ignored by memory 14 while in access phase. The memory 14 only recognizes the addresses from the programmed row and column test counters. The TDQ signals are now used to read and write data to memory 14. A test stop row (TSR) counter signal may be used to stop the row address counter, and a test stop column (TSC) counter signal may be used to stop the column address counter while in access phase. This allows independent incrementation (or decrementation) of row and column addresses. Both the TSR and TSC counter signals may be independent of the CLK signal. In general, with some embodiments, programming of memory 14 during testing can be asynchronous. In other embodiments or as an option, programming can be synchronous for memory 14. Also, during access phase, the memory 14 may operate synchronously or asynchronously, depending on the memory specification.

To exit test mode, in one embodiment, the TEST signal is brought to a low value ("0"), which clears all test operations and disables the test input buffers.

With the systems and methods, according to various embodiments of the invention, an IC chip (e.g., memory 14) which is packaged along with one or more other chips (e.g., system IC 12) can be fully tested without requiring a significant number of dedicated I/O terminals. Control signals from complex external test equipment (e.g., a standard external memory tester) can be provided to all data, control, and access pads of the desired IC chip for thorough and complete testing using a variety of test patterns and sequences. Furthermore, the IC chip can include fuses and corresponding soft-blow circuits to fine tune electric or other operational characteristics. These embodiments provide complete and flexible testing of IC devices.

In some embodiments, the systems and methods described herein can be used in conjunction with the systems and methods described in related U.S. patent application Ser. No. 09/666,208 entitled "Chip Testing Within a Multi-Chip Semiconductor Package," filed on Sep. 21, 2000, assigned to the same assignee and incorporated by reference herein in its entirety.

FIG. 1B is a block diagram of another exemplary semiconductor device 50, according to an embodiment of the present invention. Semiconductor device 50 can be similar in many respects to semiconductor device 10 depicted in FIG. 1A. That is, semiconductor device 50 may comprise a system IC 12 and a memory 14 (each with bonding pads 16 provided thereon), and external terminals 20 for communicating data/information into and out of semiconductor device 50. Memory 14 receives signals from system IC 12. Furthermore, memory 14 may comprise one or more test buffer multiplexer circuits 22 for enabling multiplexing between signals generated in normal operation and signals generated for testing, thereby allowing memory 14 to be thoroughly tested with external test equipment. Memory 14 can also include fuse circuit 91 and corresponding soft-blow circuit 90. Alternatively or in addition, system IC 14 or another IC device within the semiconductor device 50 can also include one or more fuse circuits and corresponding soft-blow circuits.

In semiconductor device 50, system IC 12 and a memory 14 are provided in stacked arrangement. In this arrangement, system IC 12 may be attached to memory 14 using, for example, any suitable adhesive. Traces 19 may be formed on memory 14 for pin-out for system IC 12. Furthermore, although not depicted, some traces 19 may be formed on system IC 12 for pin-out for memory 14.

In one embodiment, one or both of the test analog voltages (i.e., word-line voltage (VCCP) and analog memory substrate voltage (VBB)) can be multiplexed with voltages used in normal operation. For this, respective test buffer multiplexer circuits 22 may be provided or incorporated in memory 14.

Test Buffer Multiplexer Circuit

Figure 2A:
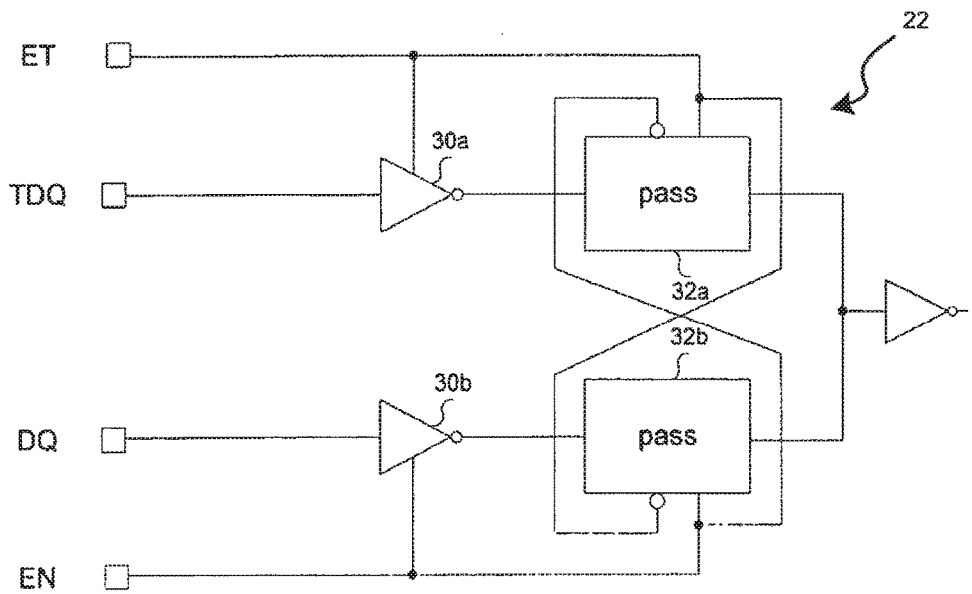
FIGS. 2A-2C are schematic block diagrams illustrating exemplary test buffer multiplexer circuits.

FIG. 2A is schematic diagram of an exemplary implementation of the test buffer multiplexer circuit 22 (FIGS. 1A and 1B). Test buffer multiplexer circuit 22 may be implemented or incorporated in the memory 14 to support its testing. In this embodiment, as depicted, test buffer multiplexer circuit 22 comprises buffer circuits 30a, 30b and pass gate circuits 32a, 32b.

Figure 3:
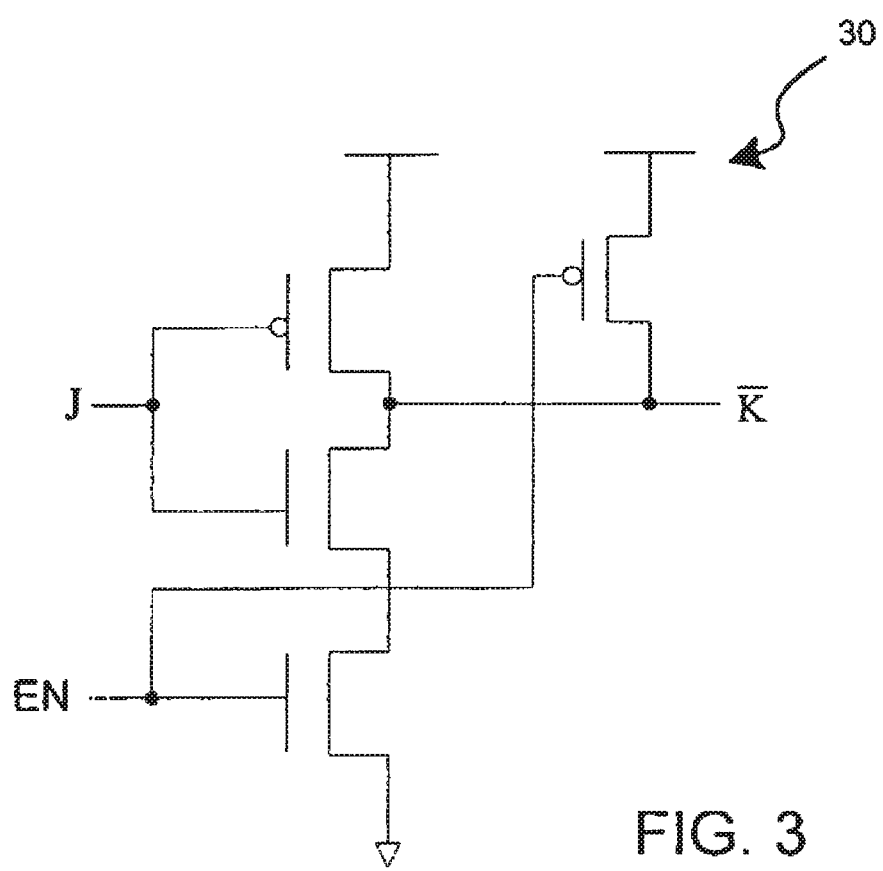
FIG. 3 is a schematic diagram illustrating an exemplary input buffer circuit.

One buffer circuit 30b may be connected to receive a signal (e.g., data (DQ)) from system IC 12, while the other buffer circuit 30a may be connected to receive a corresponding test signal (e.g., test data (TDQ)) from a testing machine via an external terminal 20. Buffer circuit 30a is enabled by an enable test (ET) signal, while buffer circuit 30b is enabled with an enable normal (EN) signal. The ET and the EN signals can be complementary signals, and may both be supported by the same external pin or lead which, for example, receives the TEST signal. This external pin can be either dedicated for receiving the TEST signal to the place the memory 14 in test mode, or alternatively, shared between the memory 14 and a system IC 12. An exemplary implementation of a buffer circuit 30 is depicted in FIG. 3.

Pass gate circuit 32a is coupled at its input to receive the output of buffer circuit 30a. Pass gate circuit 32b is coupled at its input to receive the output of buffer circuit 30b. Both pass gate circuits 32 receive the enable test and enable normal signals. Each pass gate circuits 32 generally function to pass the value of a signal appearing at its input as the value of its output signal upon a particular combination of values for the enable test and enable normal signals. For example, in one embodiment, when the enable test signal has a high value (or "1") and the enable normal has a low value (or "0"), then the value of the output signal from buffer circuit 30a appears at output Y for the test buffer multiplexer circuit 22. An exemplary implementation of pass gate circuit 32 is described in related U.S. application Ser. No. 09/967,389 entitled "Testing of Integrated Circuit Devices," filed on Sep. 28, 2001, assigned to the same assignee and incorporated by reference herein in its entirety.

Although only a single test buffer circuit 22 is depicted here in FIG. 2A for the data signal and its counterpart test signal, it should be understood that a plurality of test buffer circuits 22 may be provided on a memory 14 for multiplexing various other signals from a system IC 12 (e.g., CLK, CKE, CS, RAS, CAS, WE, DQM, BA, and AP) and their counterpart test signals (e.g., TCLK, TCKE, TCS, TRAS, TCAS, TWE, TDQM, TBA, and TAP).

In operation, when the memory 14 on which test buffer multiplexer circuit 22 is implemented is in normal operation, then the value of the signal from the system IC (e.g., DQ) is buffered and passed as the output Y of the multiplexer circuit 22. Alternatively, when the memory 14 is placed in test mode, then the value of signal from external testing equipment (e.g., TDQ) is buffered and passed as the output Y of the multiplexer circuit 22.

Figure 2B:
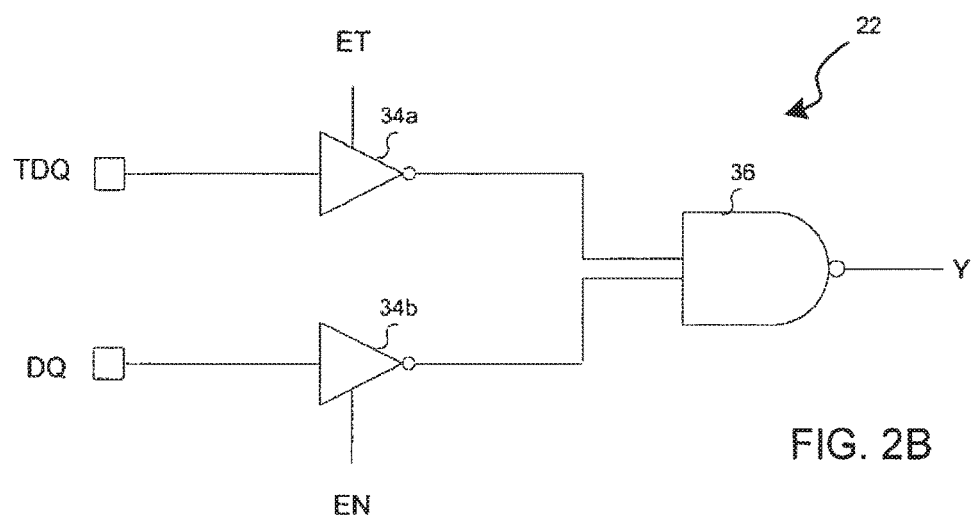

FIG. 2B is schematic diagram of another exemplary implementation of the test buffer multiplexer circuit 22 (FIGS. 1A and 1B). In this embodiment, as depicted, test buffer multiplexer circuit 22 comprises buffer circuits 34a, 34b and NAND gate 36.

Buffer circuits 34b may be connected to receive a signal (e.g., data (DQ)) from system IC 12, and buffer circuit 34a may be connected to receive a corresponding test signal (e.g., test data (TDQ)) from a testing machine via an external terminal 20. Buffer circuits 34a and 34b are enabled by the enable test (ET) and enable normal (EN) signals, respectively. NAND gate 36 receives and performs a "NAND" operation on the outputs of buffer circuits 34a and 34b. NAND gate 36 outputs a value of the Y signal, which is the output for the multiplexer circuit 22.

As with FIG. 2A, although only a single test buffer circuit 22 is depicted here in FIG. 2B for the data signal and its counterpart test signal, it should be understood that a plurality of test buffer circuits 22 may be provided on the memory 14 for multiplexing various other signals from a system IC 12 and their counterpart test signals.

Figure 2C:
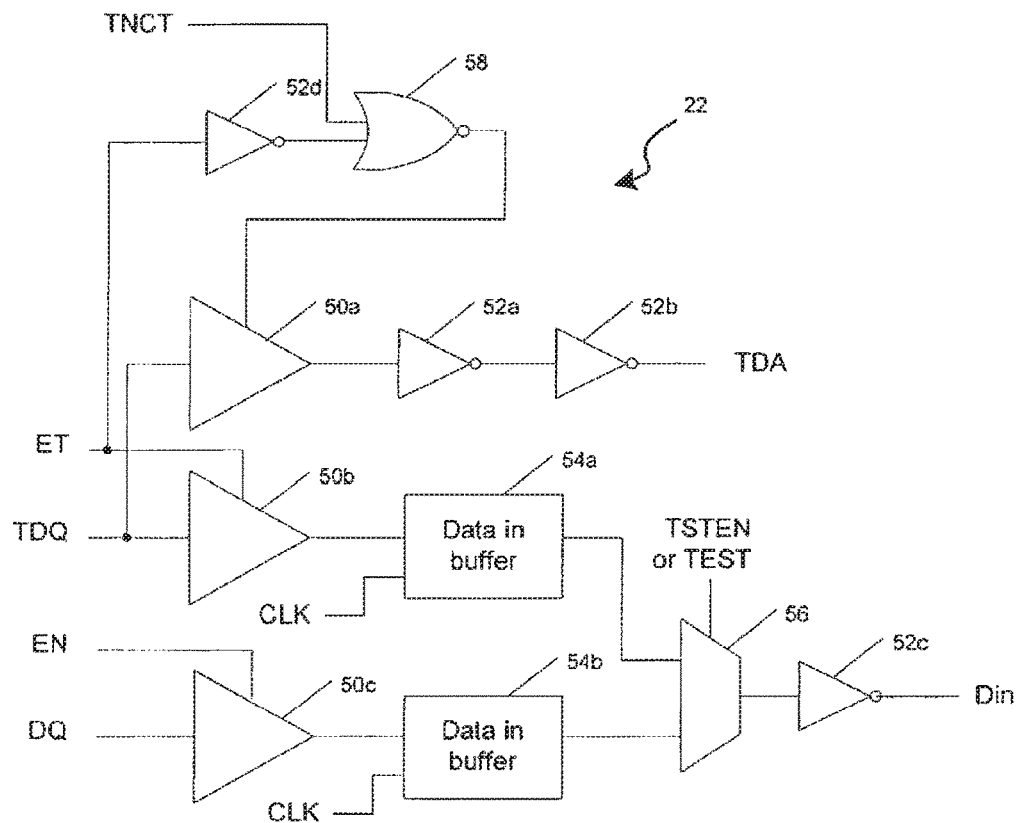

FIG. 2C is schematic diagram of yet another exemplary implementation of the test buffer multiplexer circuit 22 (FIGS. 1A and 1B). In this embodiment, as depicted, test buffer multiplexer circuit 22 comprises buffer circuits 50a, 50b, 50c, inverter gates 52a, 52b, 52c, 52d, data buffers 54a, 54b, a multiplexer (MUX) 56, and a NOR gate 58.

Buffer circuit 50a and inverter gates 52a, 52b may be part of a path for inputting program code data into memory 14, for example, during a programming phase of test mode for the memory 14. Buffer circuit 50a may receive a test signal (e.g., test data (TDQ)) from an external test machine. Buffer circuit 50a can be enabled by a signal that is derived from logic operations on the enable test (ET) and a test control or test counter (TCNT) signal. The output of this buffer circuit 50a and inverter gates 52a, 52b is a TDA signal for programming memory 14. In one embodiment, eight TDA signals (i.e., TDA[0:7]) may be supported for programming up to 256 test codes. Eight TDQ signals (i.e., TDQ[0:7]) may be supported as well.

In one embodiment, the TCNT signal may default to a low value upon entry into test mode. If the memory 14 is in the programming phase of test mode, the TCNT signal may have a low value. If memory 14 is in the access phase of test mode, test control (TCNT) signal may have a high value. TCNT signal may be set to a high value using the SET and LOAD (code) signals. For example, in one embodiment, the TCNT signal can be set to VDD by bringing the SET signal to a high value with the values of TDQ[7:0]=00110000. The LOAD signal is used for loading registers with test data, such as test address or test pattern or fuse configuration.

Buffer circuit 50b and data buffer 54a may be part of a path for inputting test data into memory 14, for example, during an access phase of test mode for the memory 14. Buffer circuit 50b is enabled by the enable test (ET) signal and may receive the test data (TDQ)) from an external test machine. Data buffer 54a is connected to receive the output signal of buffer circuit 50b and a clock (CLK) signal. Data buffer 54a latches the output of circuit 50b and may output the same on an edge of the CLK signal.

Buffer circuit 50c and data buffer 54b may be part of a path for inputting data into memory 14, for example, during normal operation for the memory 14. Buffer circuit 50c is enabled by the enable normal (EN) signal and may receive the data (DQ)) from system IC 12. Data buffer 54b is connected to receive the output signal of buffer circuit 50c and a clock (CLK) signal. Data buffer 54b latches the output of circuit 50c and may output the same on an edge of the CLK signal.

Multiplexer 56 is connected to receive the output signals of data buffers 54a and 54b, and can be enabled with a TEST signal, a TSTEN signal, or a TCNT signal. Depending on the values of the EN and ET signals, multiplexer 56 will pass (via inverter gate 52c) either the output of data buffer 54a or the output of data buffer 54b to other circuitry on memory 14. In particular, if memory 14 is in test mode (access phase), the output of data buffer 54a is provided to the memory 14 for testing of same. If memory 14 is in normal operating mode, the output of data buffer 54a is provided to the memory 14. In other embodiments, other circuit, such as a NAND gate, can be used instead of multiplexer 56.

Test Input Control Buffer Circuits

Figure 4:
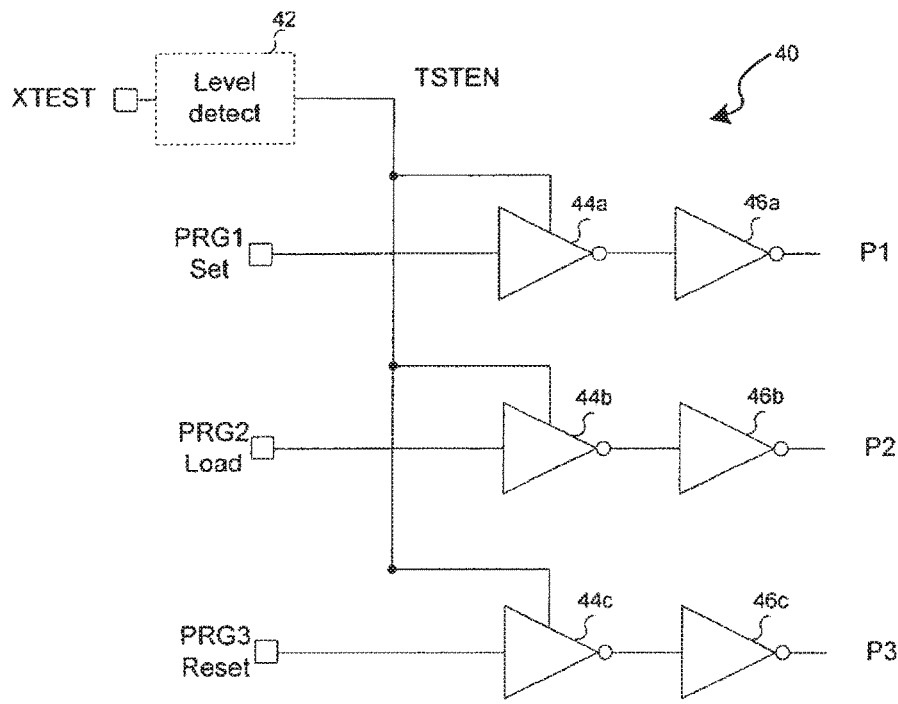
FIG. 4 is a schematic block diagram of an exemplary test input control buffer circuit.

FIG. 4 is a schematic diagram of an exemplary implementation of the test input control buffer circuit 40 (FIGS. 1A and 1B). Test input control buffer circuit 40 may be implemented or incorporated in the memory 14 to supporting the testing thereof. Test input control buffer circuit 40 generally functions to receive and buffer control signals for programming of memory 14 during the programming phase of test mode. As depicted, test control buffer circuit 40 comprises a level detect circuit 42, input buffer circuits 44a, 44b, and 44c, and inverter gates 46a, 46b, and 46c.

Figure 5:
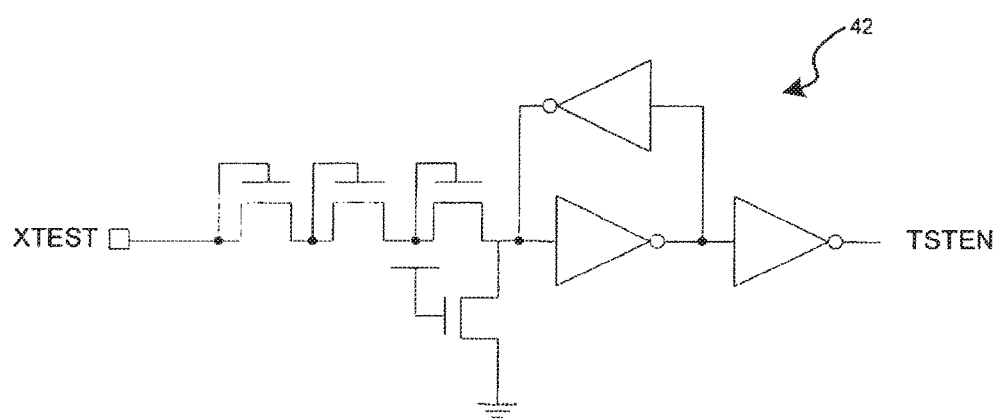
FIG. 5 is a schematic block diagram illustrating an exemplary level detect circuit.

Level detect circuit 42 is optional and can be provided as part of test input control buffer circuit 40 when the external pin or lead for receiving the TEST signal is shared between the memory 14 and a system IC 12. In such case, because it would be undesirable to inadvertently place memory 14 into test mode during normal operation, a voltage level which differs from the voltage levels used in normal operation is used for putting the memory 14 into test mode. This voltage level can be, for example, a negative voltage (e.g., −3V) or a higher than normal voltage (e.g., 7V if VDD for memory 14 is 3.3V). Level detect circuit 42 receives the external TEST signal (XTEST) and generates an internal test enable (TSTEN) signal that is provided to each of input buffer circuits 44a, 44b, and 44c. The TSTEN signal enables input buffer circuits 44. An exemplary implementation for level detect circuit 42 is depicted in FIG. 5.

Referring again to FIG. 4, if the external pin for receiving the TEST signal is dedicated, level detect circuit 42 is not needed and thus would not be present in test input control buffer circuit 40. In this case, the external TEST signal can be applied directly to input buffer circuits 44. In one embodiment, for this situation, a high value for the TEST signal causes memory 14 to be in test mode, while a low value for the TEST signal takes memory 14 out of test mode.

A separate combination of input buffer circuit 44 and inverter gate 46 is provided for each of a number of programming control (PRG) signals, such as, for example, the SET, LOAD, and RESET signals. For each combination, when the input buffer circuit 44 is enabled, the respective control signal is buffered in circuit 44 and output to the inverter gate 46 where the signal is inverted. The output of each inverter gate 46 is a respective program P signal (separately labeled P1, P2, P3). The program P signals may be provided to control the test programming of the memory 14 when it is in the programming phase of test mode. For example, these program P signals can be used to set flags and other conditions in memory 14.

It should be noted that in alternative implementations for a test input control buffer circuit 40, any number of input buffer circuits 44 and inverter gates 46, or any other suitable element could be used to support control signals that are in addition to, or instead of, the specific signals depicted in FIG. 4.

Enable Test and Enable Normal

Figure 6:
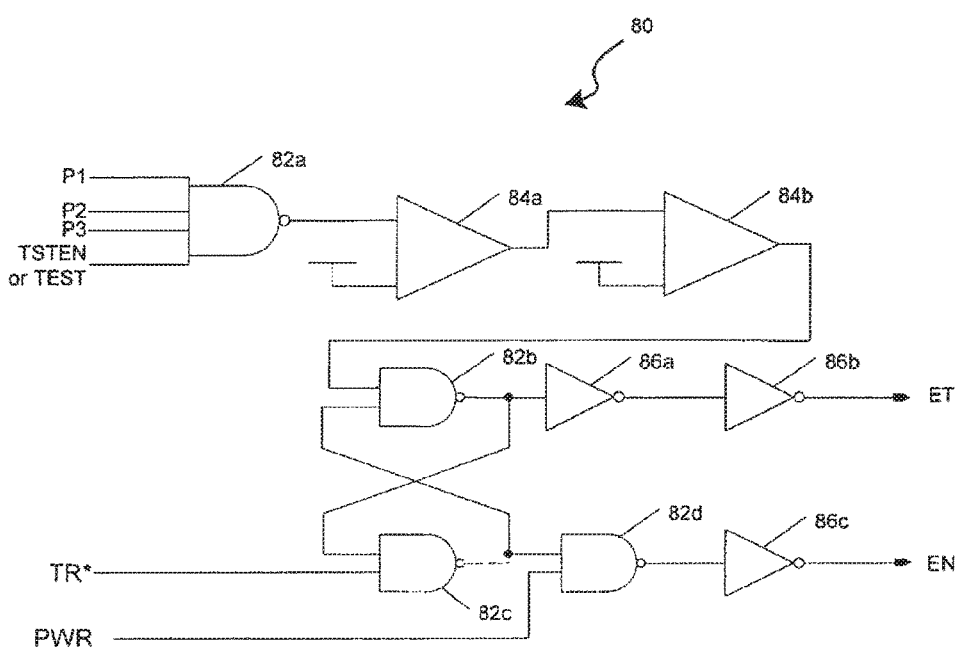
FIG. 6 is a schematic block diagram illustrating an exemplary circuit for generating enable test and enable normal signals.

FIG. 6 is a schematic diagram of an exemplary implementation of a circuit 80 for generating the enable test (ET) and the enable normal (EN) signals. As depicted, this circuit 80 comprises NAND gates 82a, 82b, 82c, delay circuits 84a, 84b, and inverter gates 86a, 86b, and 86c.

NAND gate 82a can be connected to receive the program P and TSTEN signals from the test input control buffer circuit 40 (FIGS. 1A, 1B and 4). The program P signals can be associated with or correspond to the SET, LOAD, and RESET signals. The delay circuits 84a and 84b delay the output generated by the NAND gate 82a. The delay circuits 84a and 84b may also filter noise or voltage spikes, and may prevent unintentional entry into test mode. Delay circuits 84a and 84b may be replaced with a single, larger delay circuit in alternative embodiments.

NAND gates 82b and 82c are cross-connected at one input each. The other input of NAND gate 82b is connected to receive the output of delay circuit 84b. The other input of NAND gate 82b is connected to receive a test reset (TR) signal. The test reset signal, which may be derived from a reset signal, can be used to reset an individual test mode without completely exiting test mode. Inverter gates 86a and 86b are connected to receive the output of NAND gate 82b, while NAND gate 82d and inverter gate 86c are connected to receive the output of NAND gate 82c. The output of inverter gate 86b is the enable test (ET) signal, and the output of inverter gate 86c is the enable normal (EN) signal. The ET and EN signals may be applied to the test buffer multiplexer circuit 22 (see FIGS. 1A, 1B, 2A, 2B, and 2C).

In operation, depending on the combination of values for the TSTEN and program P signals, circuit 80 will output particular values for the enable test (ET) and the enable normal (EN) signals for enabling the test or normal buffers.

Control Signal Multiplexer Circuits

Figure 7:
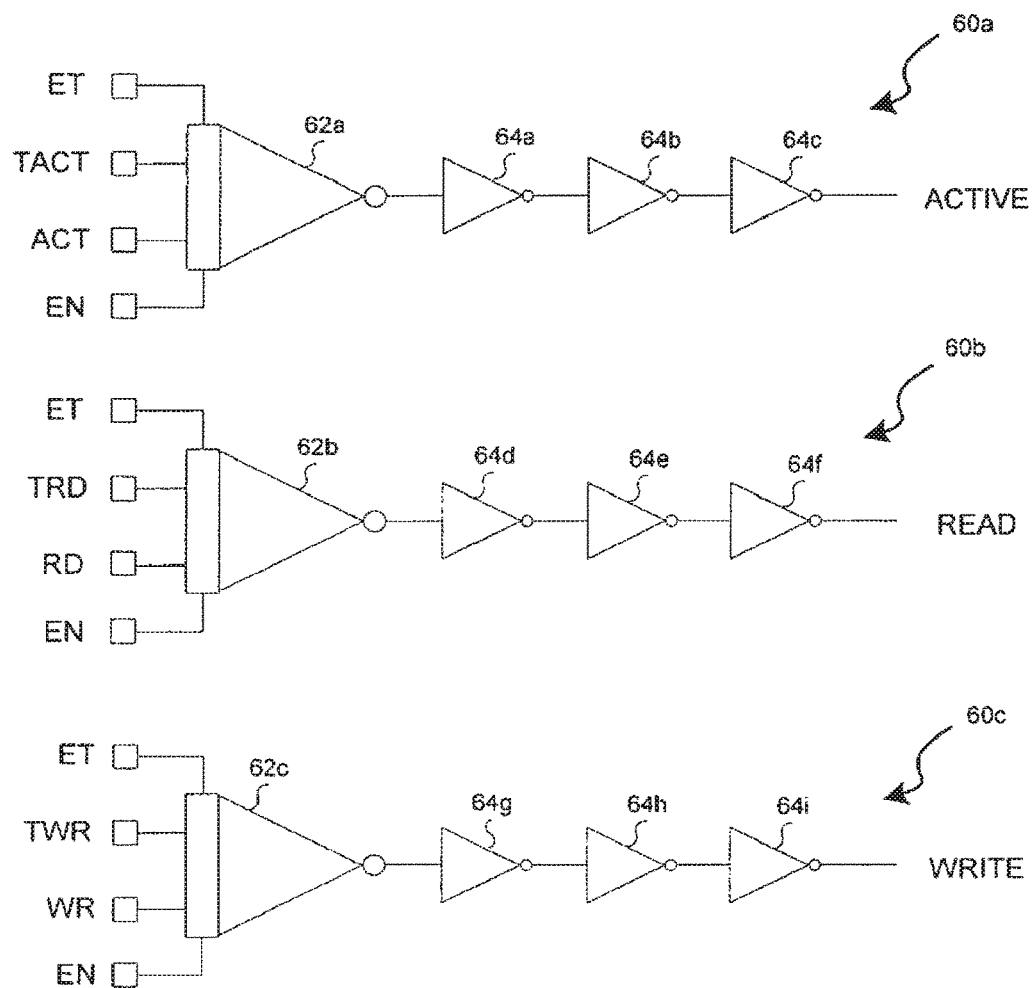
FIG. 7 is a schematic block diagram illustrating an exemplary control signal multiplexer circuits.

FIG. 7 is a schematic diagram of an exemplary implementation of control signal multiplexer circuits 60a, 60b, and 60c. Control signal multiplexer circuits 60 may be implemented or incorporated in the memory 14 (FIGS. 1A and 1B) to support its testing.

In general, each control signal multiplexer circuit 60 functions to receive, multiplex, and buffer a control signal and its counterpart test signal. These control signals can be, for example, an active (ACT) signal, a read (RD) signal, and a write (WR) signal, and the counterpart test signals can be a test ACT (TACT) signal, a test RD (TRD) signal, and a test WR (TWR) signal, respectively. The control signals (ACT, RD, and WR) may be received at pads 16 on memory 14 which are coupled to the system IC 12. The respective counterpart test signals (TACT, TRD, and TWR) may be received at pads which are connected to external terminals 20 that are shared between memory 14 and system IC 12. It should be understood, that in other embodiments, control signals in addition to or other than one or more of those described immediately above may be multiplexed.

As depicted, each control signal multiplexer circuit 60 comprises a multiplex buffer 62 (separately labeled 62a, 62b, and 62d) coupled to a plurality of inverter gates 64 (separately labeled 64a-64i).

In one embodiment, each multiplexer buffer 62 can be implemented with substantially similar circuitry as used for either of the implementations of test buffer multiplexer circuit 22 depicted in FIGS. 2A and 2B. Each multiplex buffer 62 receives an enable test (ET) signal, an enable normal (EN) signal, a respective control signal, and the counterpart test signal. During normal operation for memory 14, multiplex buffer 62 is enabled by the enable normal signal, which allows the respective control signal (e.g., ACT, RD, or WR) to be buffered and output by the multiplex buffer 62. In test mode, multiplex buffer 62 is enabled by the enable test signal, which allows the respective counterpart test signal (e.g., TACT, TRD, or TWR) to be buffered and output by the multiplex buffer 62.

The output signal from a multiplex buffer 62 is provided to the first in a respective sequence of inverter gates 64. As shown, three inventor gates 64 are provided in each sequence. The output of the last inverter gate 64 of each sequence is provided as a control signal to memory 14, for either normal operation or testing (depending on the ET and EN signals).

It should be noted that other control signal multiplexer circuits 60 may be provided to support control signals that are in addition to, or instead of, the specific signals depicted in FIG. 7.

Set and Load Sequence

Figure 8:
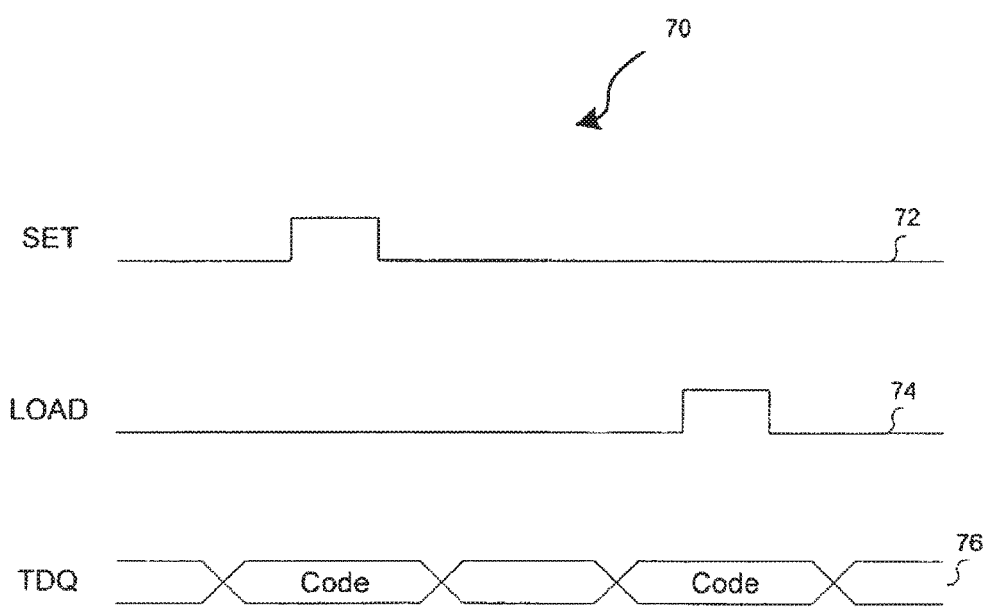
FIG. 8 is a schematic timing diagram illustrating a set and load sequence.

FIG. 8 is an exemplary timing diagram of a set and load sequence 70. When memory 14 (FIGS. 1A and 1B) is in test mode, sequence 70 can be used to load codes into memory 14 during the programming phase. In particular, in one embodiment, test modes, test patterns and test addresses may be programmed in this phase. The set and load sequence 70 can also be used to program different fuse configurations.

Referring to FIG. 8, waveforms 72, 74, and 76 are given for the SET signal, the LOAD signal, and a TDQ signal. One or more TDQ signals may be used to read and write test data, set test mode codes, load row and column addresses, program least significant bits (LSB) for row and column counters, and load test data patterns. In one embodiment, there can be eight TDQ signals: TDQ[0:7]. As the exemplary waveforms in FIG. 8 illustrate, the programming for testing memory 14 can be performed asynchronously (i.e., without a clock signal). The SET and LOAD signals are used to input codes for setting test modes and enable test address or vectors to be loaded. These codes may be provided in the one or more TDQ signals. The codes can indicate or represent, for example, any of the following: no test, load row address mode, reserve, load column address mode, set row counter LSB, set/load test data background equations, all even row enable, all odd row enable, disable all pumps and regulators, disable redundant rows and columns, set column counter LSB, start test counter, load data pattern, set row counter count down, set column counter count down, and individual DQ access mode.

For example, in one embodiment, to load an initial burst column address (i.e., the starting address in a column burst counter), the following command is issued using the timing shown in FIG. 8:

SET=1 with TDQ[7:0]=00000011→this sets the "Load Column Address" bit active (e.g., LCA=1).

LOAD=1 with TDQ[7:0]="start address"→load value at TDQs to the column address counter.

For setting just a test mode (e.g., disabling a voltage regulator, setting access phase (i.e., TCNT=1), or setting 8×parallel test modes), then the SET signal in combination with valid TDQs is sufficient. In one embodiment, test modes can be persistent or non-persistent. Test modes that are non-persistent go away once a new code is programmed. Test modes that are persistent will remain in effect even after a new code is programmed.

Fuse Configurations

Figure 9:
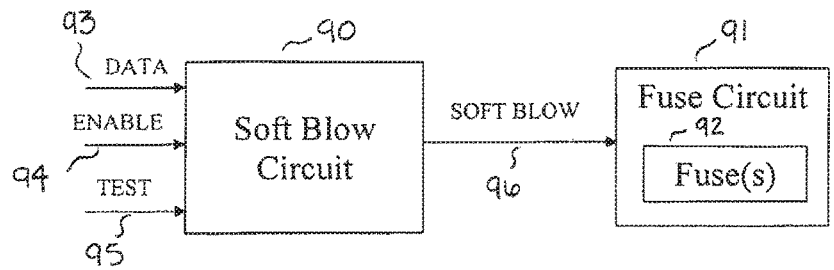
FIGS. 9 and 10 are schematic block diagrams illustrating exemplary soft-blow fuse systems for simulating different fuse configurations in IC devices.

FIG. 9 schematically illustrates an exemplary soft-blow fuse system including the fuse circuit 91 and the corresponding soft-blow circuit 90. The fuse circuit 91 includes one or more fuses 92 that can be permanently blown, for example, by laser. During testing, however, the soft-blow circuit 90 and the fuse circuit 91 can be programmed without permanently blowing the fuses 92 to generate electric and other operational conditions that are present if some of the fuses 92 were actually blown. For example, the soft-blow circuit 90 and fuse circuit 91 can be implemented in semiconductor devices 10 and 50 (FIGS. 1A and 1B) to simulate electric and other operational conditions which are present when fuses 92 are selectively blown in the fuse circuit 91. Thus different fuse configurations can be tested and an optimal fuse configuration can be identified without permanently blowing any of the fuses 92 in the fuse circuit 91 during the test. Once the optimal fuse configuration has been found, the fuses 92 can be permanently blown, for example, by a laser beam.

In the implementation shown in FIG. 9, the soft-blow circuit 90 receives one or more data signals 93, an enable signal 94 and a test signal 95. The data signals 93 define a simulated fuse configuration, and the enable and test signals 94 and 95 can be used to control operations related to the testing of the different fuse configurations. In other implementations, the soft-blow circuit 90 can receive alternative or additional signals to control the fuse configuration test.

The data signals 93, enable signal 94 and test signal 95 can be received on multiple input lines. For example, each of the data signals 93, enable signal 94 and test signal 95 can be received on a separate input line. Alternatively, multiple signals can be received on a single input line. For example, multiple data signals 93 can be received sequentially through a single serial input line. Or the enable and test signals 94 and 95 can be received through the same or a different serial input line. In one implementation, the enable signal 94 also contains test information. For example, the enable and test signals 94 and 95 can be combined by an AND operation and driven using a single line.

The data signals 93 can define the fuse configuration directly or indirectly. In one implementation, each data signal 93 directly corresponds to a respective fuse 92, and the level of the data signal 93 directly determines whether the respective fuse 92 should be blown or not in the simulated fuse configuration. Alternatively, the data signals 93 can include short codes that correspond to different fuse configurations whose details are defined internally within the soft-blow circuit 90. Using such codes might be advantageous when the fuse circuit 91 includes a large number of fuses 92 but operational requirements limit the possible fuse configurations.

The enable and test signals 94 and 95 control operations related to the testing of the different fuse configurations. In one implementation, the test signal 95 activates the soft-blow circuit 90 and the enable signal 94 controls inputting the data signals 93 into the soft-blow circuit 90. For example, the test signal 95 can correspond to the TEST signal that puts the entire semiconductor device 10 into a test mode (FIG. 1A). Thus, the TEST signal activates the soft-blow circuit 90 in the test mode and disables it during normal operation. Furthermore, the enable signal 94 can be implemented to control data input through the data signals 93 into the soft-blow circuit 90 during a programming phase in accordance with the TEST, SET and LOAD signals which control the entire test of the semiconductor device 10.

The soft-blow circuit 90 generates soft-blow ("SB") signals 96 that are transmitted to the fuse circuit 91 to determine the simulated configuration for the fuses 92. For each allowable configuration of the fuses 92, the fuse circuit 91 has a corresponding state of operation that can be set by the soft-blow signals 96. The same state of operation can also be set by permanently blowing selected fuses 92. Or the state of operation can be set by the soft-blow signals 96 in combination with permanently blown fuses 92.

In one implementation, soft-blow signals 96 have a default value during normal operation so that the fuse circuit's state of operation is determined only by the configuration of permanently blown fuses 92; during testing, however, the fuse circuit's state of operation is determined only by the soft-blow signals 96. Thus, different fuse configurations can be simulated during the test without actually changing the configuration of permanently blown fuses 92. The soft-blow circuit 90 can also include initialization circuitry to ensure that the soft-blow signals 96 take their default value at startup and after returning from test to normal mode of operation.

In alternative implementations, the fuse circuit's state of operation can be determined as a function of both the soft-blow signals 96 and the permanently blown fuses 92 during the test. Or the soft-blow signals 96 can be effective to determine the fuse circuit's state of operation not only during the test but during the normal mode of operation as well.

Figure 10:
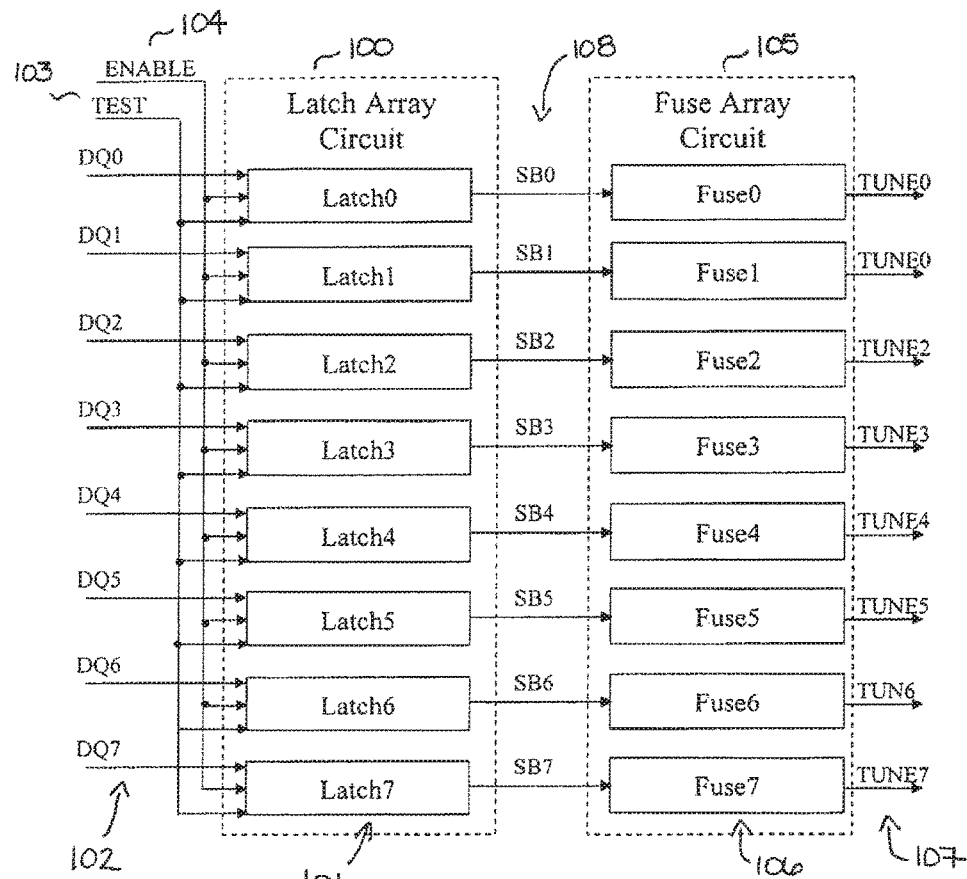

FIG. 10 schematically illustrates an exemplary implementation of a soft-blow fuse system that can be implemented in semiconductor devices 10 and 50 (FIGS. 1A and 1B). In the exemplary implementation, the system includes a latch array circuit 100 and a fuse array circuit 105. The latch and fuse array circuits 100 and 105 can be implemented in the same or different chips. If implemented in the same chip, the latch and fuse array circuits 100 and 105 can be located in a designated area of the chip relatively close to each other. Thus wiring between the latch and fuse circuits 100 and 105 can be minimized. Alternatively, the latch and fuse array circuits 100 and 105 can be implemented in any other configuration which suits the particular design of the semiconductor device in that chip.

The latch array circuit 100 is controlled by test signal 103 and enable signal 104 to receive DQ0-DQ7 data signals 102 that define a fuse configuration during testing. The latch array circuit 100 generates SB0-SB7 soft-blow signals in accordance with the test, enable and DQ0-DQ7 data signals 103, 104 and 102, respectively. The SB0-SB7 soft-blow signals are transmitted to the fuse array circuit 105 to determine the fuse configuration in accordance with the data signals 102. The fuse array circuit 105 generates Tune0-Tune7 signals 107 that are determined by the current fuse configuration to fine tune or optimize other components of the semiconductor device.

In one implementation, the soft-blow fuse system uses Test DQ signals (TDQ<0:7>; not shown) in addition to using the normal DQ0-DQ7 data signals. The Test DQ signals can be implemented to allow for more logistical flexibility. For example in a SiP package, the TDQ<0:7> signals can also be used to program the "soft fuses." Thus each fuse can be addressed using the TDQ or DQ signals, which allows electrically programming the fuses by adding a "program line" that can be implemented in a non-volatile structure, such as a one-time programmable memory cell or anti-fuse. Such a program line may be brought to a desired programming voltage level to switch the memory bit or blow the anti-fuse. In this case, either an external tester or the secondary IC (e.g. ASIC) can run a soft-fuse test program and then program the fuses according to the results of the test.

The latch array circuit 100 includes Latch0-Latch7 latches 101. Each of the Latch0-Latch7 latches 101 receives the test and enable signals 103 and 104 along with a respective one of the DQ0-DQ7 data signals 102. Thus, Latch0 receives DQ0 data signal, Latch1 receives DQ1 data signal, ... etc., and Latch7 receives DQ7 data signal. Based on the received signals, each of the Latch0-Latch7 latches 101 generates a respective one of the SB0-SB7 soft-blow signals 108. Thus, Latch0 generates SB0 soft-blow signal, Latch1 generates SB1 soft-blow signal, ... etc., and Latch7 generates SB7 soft-blow signal.

Each of the Latch0-Latch7 latches 101 is controlled by the test and enable signals 103 and 104. In one implementation, the test signal 103 corresponds to the TEST signal whose active value puts the entire semiconductor device, including the soft-blow fuse system, into a test mode. Thus in the test mode, the enable signal 104 can control receiving ("latching on") the DQ0-DQ7 data signals 102 and outputting the SB0-SB7 soft-blow signals 108 in accordance with the received DQ0-DQ7 data signals. The TEST signal's inactive value, on the other hand, can set the device into the normal operation mode in which the SB0-SB7 soft-blow signals 108 have a default value that is independent of the enable and data signals 104 and 102, and sets the fuse array circuit 105 into a state of operation corresponding to the permanently blown fuses.

The fuse array circuit 105 includes Fuse0-Fuse7 single-fuse units 106. Each of the single-fuse units 106 receives a respective one of the SB0-SB7 soft-blow signals and includes a single fuse that can be permanently blown, for example, by laser. Based on the respective soft-blow signal and the fuse's permanent state (blown or intact), each of the single-fuse units 106 generates a respective one of the Tune0-Tune7 signals 107. If the respective soft-blow signal has a non-active (default) value (for example, in the normal operation mode), the single-fuse unit can generate a respective Tune signal value that depends only on the fuse's permanent state in that unit. If the respective soft-blow signal has an active (non-default) value (for example, in the test mode of operation), the single-fuse unit can generate a respective Tune signal whose value corresponds to a state of operation in which the unit's fuse is permanently blown. Thus, a "blown" value of the Tune signal can be generated during a test even if the unit's fuse is not permanently blown. Such simulated "soft blow" of the fuse allows testing different fuse configurations to fine tune or optimize the device's operation.

In alternative implementations, the latch array circuit 100 and fuse array circuit 105 can include more, less, or a non-matching number of latches 101 and single-fuse units 106. Furthermore, the latches 101 and single fuse units 106 can be differently organized. For example, one latch can generate a soft-blow signal value that is transmitted to more than one of the single-fuse units. Or a single-fuse unit can receive and combine soft-blow signals from more than one of the latches.

Figure 11:
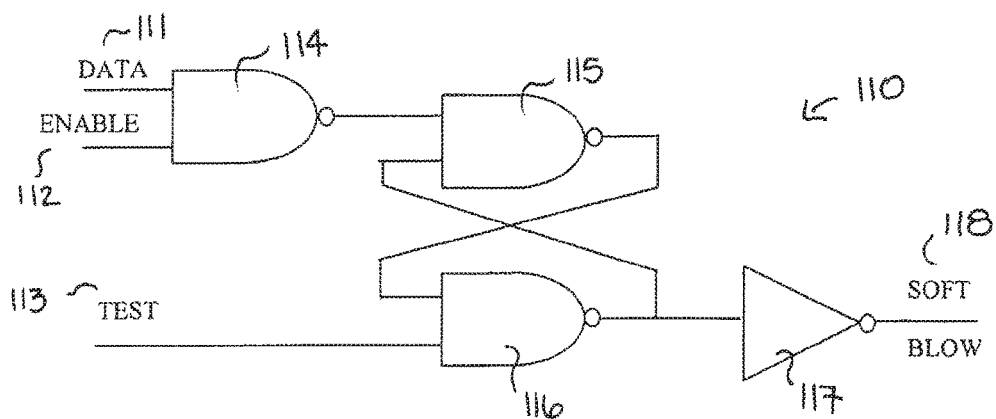
FIG. 11 is a schematic block diagram illustrating an exemplary soft-blow circuit.

FIG. 11 schematically illustrates an exemplary soft-blow circuit 110. The soft-blow circuit 110 can be used to implement, for example, soft-blow circuit 90 shown in FIG. 9 or any of the Latch0-Latch7 latches 101 shown in FIG. 10. The soft-blow circuit 110 receives soft fuse configuration data 111 and outputs a soft-blow signal 118 that can be used to control an operational state of a fuse circuit, such as the fuse circuit 91 including the one or more fuses 92 (FIG. 9). The soft-blow circuit 110 also receives enable and test signals 112 and 113, respectively, that control receiving the fuse configuration data 111 and outputting the soft-blow signal 118.

In the particular implementation, the soft-blow circuit 110 includes NAND gates 114, 115 and 116, and an inverter 117. The NAND gate 114 receives the data signal 111 and the enable signal 112. The NAND gates 115 and 116 define an internal state of the soft-blow circuit 110, and the inverter 117 outputs the soft-blow signal 118. The NAND gate 116 also receives the test signal 113 which enables or disables the soft-blow circuit 110.

The NAND gate 114 receives the enable signal 112 to enable or disable receiving the data signal 111. If the enable signal 112 is inactive (i.e., has a value corresponding to logical ZERO), the output of the NAND gate 114 is a logical "ONE" independent of the value of the data signal 111. Thus, receiving the data signal 111 is disabled. If the enable signal 112 is active, the output of the NAND gate 114 corresponds to the inverse of the data signal 111. Thus, receiving the data signal 111 is enabled. In alternative implementations, the soft blow circuit 110 can receive additional signals to control receiving the data signal 111.

The NAND gate 116 receives the test signal 113 to enable or disable the output of the soft-blow circuit 110. If the test signal 113 is inactive (i.e., has a value corresponding to logical ZERO), the output of the NAND gate 116 becomes a logical "ONE" and the soft-blow signal 118 becomes inactive (default value of logical ZERO) independent of the internal state of the soft-blow circuit 110. Thus, the output of the soft-blow circuit 110 is disabled. If the test signal 113 is active, the output of the NAND gate 116 can follow the internal state of the soft-blow circuit 110. Thus, the soft-blow signal 118 can take a non-default value and the output of the soft-blow circuit 110 is enabled. In alternative implementations, the soft blow circuit 110 can receive additional signals to control its output.

The NAND gates 115 and 116 define an internal state that can be set in accordance with the enabled data signal 111. The internal state becomes a default state each time when both of the test and enable signals 113 and 112 are inactive (ZERO). The default state corresponds to the default (intact fuse) value of the soft-blow signal 118. The default state is maintained as the test signal 113 becomes active (ONE) while the enable signal 112 remains inactive (ZERO). When the enable signal 112 also becomes active (ONE), the internal state can be changed from default to "blown" in accordance with the fuse configuration data signal 111. Once the internal state becomes "blown," the soft-blow signal 118 remains active (ONE) even if the enable signal 112 becomes inactive again (while the test signal 113 remains active). The internal state and the soft-blow signal 118 become default again when the test signal 113 also becomes inactive (ZERO). Thus, the soft-blow circuit 110 can be set to generate an active soft-blow signal 118 and maintain that active value while the test signal 113 is active. In alternative implementations, the soft-blow circuit 110 can include additional logics or receive additional signals, such as a direct "reset" signal.

Figure 12:
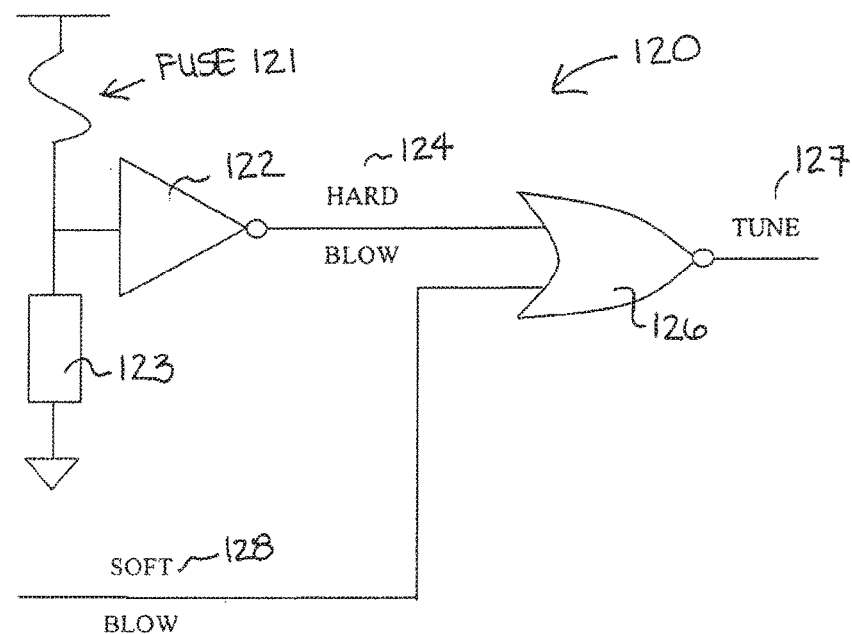
FIG. 12 is a schematic block diagram illustrating an exemplary fuse circuit that can be used in conjunction with a soft-blow circuit.

FIG. 12 schematically illustrates a fuse circuit 120. The fuse circuit 120 can be used to implement, for example, fuse circuit 91 shown in FIG. 9 or any of the Fuse0-Fuse7 single-fuse units shown in FIG. 10. The fuse circuit 120 receives a soft-blow signal 128 that can be generated by a soft-blow circuit, such as those shown in FIGS. 9-11. The fuse circuit 120 includes a fuse 121 which can be blown, for example, by a laser beam. The fuse circuit 120 generates a tune signal 127 based on the soft-blow signal 128 and the intact or blown state of the fuse 121. The tune signal 127 can be used to fine tune other circuit elements, such as voltage regulators and delay elements in the semiconductor device.

In the particular implementation, the fuse circuit 120 also includes an inverter 122, a resistor 123, and a NOR gate 126. The inverter 122 and the resistor 123 generate a hard-blow signal 124 in accordance with the intact or blown state of the fuse 121. If the fuse 121 is intact, the inverter 122 receives a high voltage level and outputs a non-active (ZERO) hard-blow signal 124. If the fuse 121 is blown, the resistor 123 pulls the input of the inverter 122 to a low voltage level, thus the inverter 122 outputs an active (ONE) hard-blow signal 124.

The NOR gate 126 combines the hard-blow signal 124 with the soft-blow signal 128 to generate the tune signal 127. The tune signal 127 represents a logical ONE only if both of the soft-blow and hard-blow signals 128 and 124 has a logical ZERO value (corresponding to intact fuse). If either of the soft-blow and hard-blow signals 128 and 124 has a logical ONE value (corresponding to "blown" fuse), the tune signal 127 represents logical ZERO. Thus, the tune signal 127 can be set to ZERO not only by permanently blowing the fuse 121, but also by providing an active soft-blow signal 128. Accordingly, the effect of the permanently blown fuse 121 can be simulated without actually blowing the fuse 121.

In alternative implementations, the fuse circuit 120 can include additional or different circuit elements. For example, the fuse circuit 120 can include circuitry to ensure proper initialization upon power-on or reset. Or the fuse circuit 120 can perform a different logical combination of the hard-blow and soft-blow signals 128 and 124. The fuse circuit 120 can also receive additional or different control signals, such as reset or normal operation enable signals.

Figure 13:
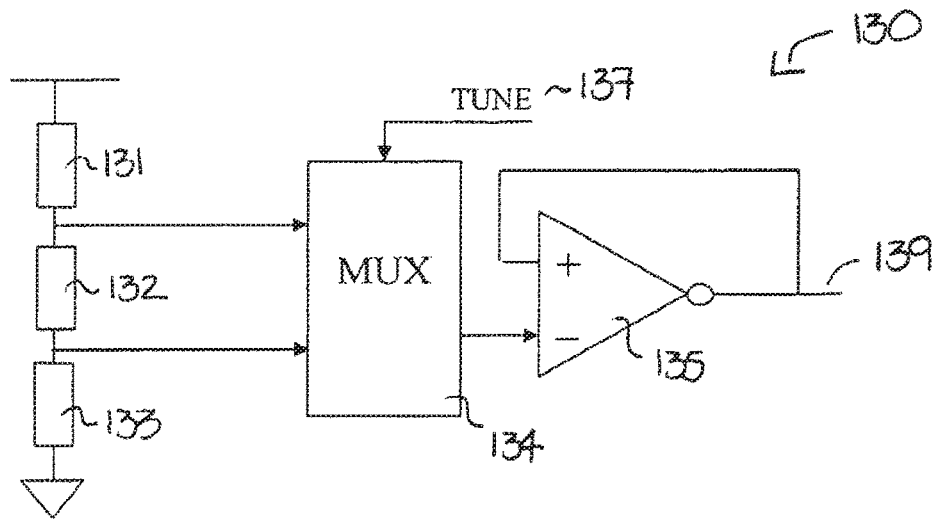
FIG. 13 is a schematic block diagram illustrating an exemplary voltage regulator that can be tuned by a fuse circuit.

FIG. 13 schematically illustrates an exemplary voltage regulator 130. The voltage regulator 130 receives a tune signal 137 and outputs a regulated voltage signal 139 in accordance with the received tune signal 137. The tune signal 137 can be generated by a fuse circuit, such as that shown in FIGS. 9, 10 and 12, in which one or more fuses define a fuse configuration that can be set with or without permanently blowing the fuses in the fuse circuit. Thus, the voltage regulator 130 can be tested without permanently blowing the fuse which tunes the voltage regulator 130 during normal operation.

In the particular implementation, the voltage regulator 130 includes a resistor chain 131-133, a multiplexer 134 and an amplifier 135. The resistor chain 131-133 generates multiple different voltage levels that are received by the multiplexer 134. The multiplexer 134 also receives the tune signal 137 to select one of the multiple different voltage levels as its output. The output of multiplexer 134 is received by the amplifier 135 which generates the regulated voltage signal 139 as the voltage regulator's output.

In alternative implementations, the voltage regulator 130 can include additional or different circuit elements. For example, the voltage regulator 130 can include circuitry to ensure proper initialization upon power-on or reset. The voltage regulator 130 can also receive additional or different control signals, such as reset signals.

Figure 14:
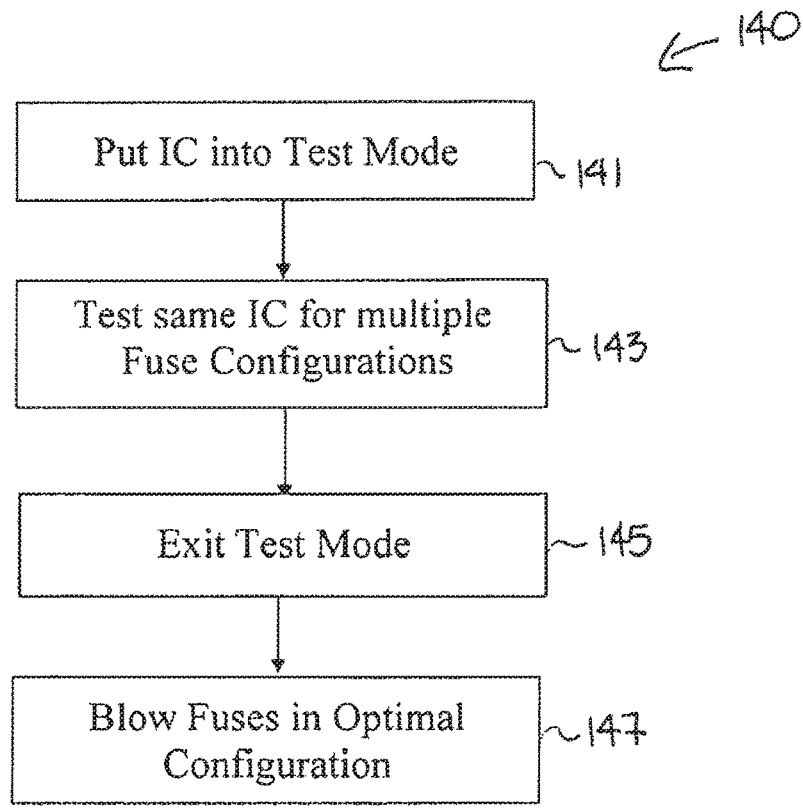
FIGS. 14-16 are flowcharts illustrating methods for testing different fuse configurations in IC devices.

FIG. 14 illustrates a method 140 for testing an IC device that includes a soft-blow fuse system with one or more soft-blow fuses, such as those illustrated in FIGS. 9-12. The method 140 can be implemented by a test system that is configured to test IC devices with soft-blow fuses.

The test system puts the IC device into a test mode (step 141). For example, the system can activate a TEST signal that puts the entire IC device into a test mode. Or, the test system can activate only the soft-blow fuse system of the IC device.

The test system tests the same IC device for multiple different fuse configurations (step 143). The different fuse configurations can be implemented in the IC device without permanently blowing any of the fuses. For example, the different fuse configurations can be programmed into a soft-blow circuit of the IC device during the test. In one implementation, the test is performed for multiple different fuse configurations without removing the IC device from the test system.

The test system completes the test by exiting from the test mode and putting the IC device into its normal mode of operation (step 145). Based on the test results for the different fuse configurations, the test system determines an optimal fuse configuration and permanently blows fuses in the IC device according to the optimal fuse configuration (step 147).

Figure 15:
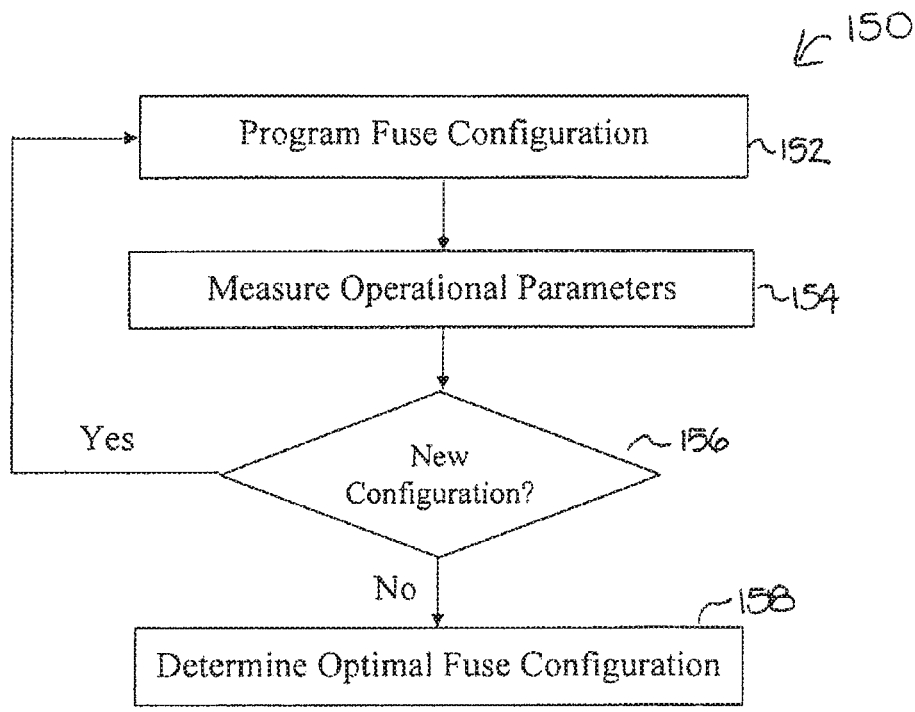

FIG. 15 illustrates a method 150 for determining an optimal fuse configuration by testing an IC device that includes a soft-blow fuse system with one or more soft-blow fuses, such as those illustrated in FIGS. 9-12. The method 150 can be implemented by a test system that is configured to test IC devices with soft-blow fuses. For example, the method 150 can be implemented to determine the optimal fuse configuration used in the method 140 (FIG. 14).

The test system programs a fuse configuration into the soft-fuse system of the IC device during the test (step 152). For example, the fuse configuration can be programmed by loading fuse configuration data into soft-blow circuits of the soft-blow fuse system. Or the test system can activate a fuse configuration which has been pre-programmed in the soft-blow circuits.

The test system measures operational parameters in the currently programmed fuse configuration (step 154). The measured operational parameters can include voltage levels, error rates, delays, or any other performance measure of the IC device.

The test system determines whether a new fuse configuration should be tested (decision 156). If a new configuration is required ("Yes" branch of decision 156), the test systems programs the new configuration into the soft-fuse system (step 152). The new fuse configuration can be tested without removing the IC device from the test system. If no more fuse configurations should be tested ("No" branch of decision 156), the test system determines an optimal fuse configuration based on the measured operational parameters (step 158).

Figure 16:
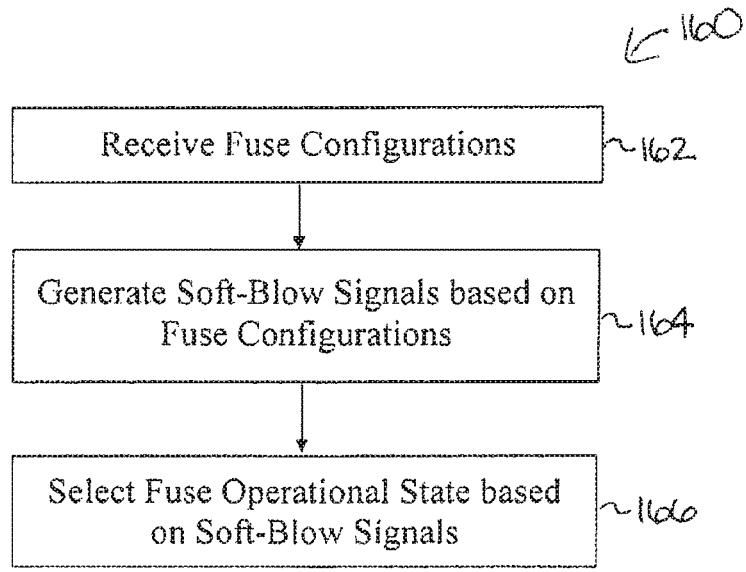

FIG. 16 illustrates a method 160 for testing an IC device that includes a fuse system with one or more soft-blow fuses, such as those illustrated in FIGS. 9-12. The method 160 can be implemented by such soft-blow fuse systems.

The fuse system receives data defining one or more fuse configurations (step 162). Based on the received fuse configuration data, the fuse system generates soft-blow signals (step 164), and based on the soft-blow signals, the fuse system selects an operational state (step 166). The selected operational state simulates blown fuses in the fuse system without permanently blowing those fuses. Thus many different fuse configuration can be tested in the same semiconductor device.

Although the present invention and its advantages have been described with reference to particular implementations, it should be understood that various changes, substitutions, and alterations can be made therein without departing from the spirit and scope of the invention as defined by the appended claims. For example, although particular semiconductor devices and device packages have been discussed, the described techniques can be used for other devices and device packages; or steps in the described methods can be performed in different order and still provide desirable results. That is, the discussion included in this application is intended to serve as a basic description. It should be understood that the specific discussion may not explicitly describe all embodiments possible; many alternatives are implicit. It also may not fully explain the generic nature of the invention and may not explicitly show how each feature or element can actually be representative of a broader function or of a great variety of alternative or equivalent elements. Again, these are implicitly included in this disclosure as it would be understood by a skilled artisan. Where the invention is described in device-oriented terminology, each element of the device implicitly performs a function. Neither the description nor the terminology is intended to limit the scope of the claims.

What is claimed is:

1. A system comprising:
   a first integrated circuit configured to operate in at least a normal mode and a test node, wherein the first integrated circuit comprises a memory device;
   a second integrated circuit comprising a buffer, wherein the second integrated circuit comprises a memory controller, both the first integrated circuit and the second integrated circuit being disposed within the same semiconductor device package; and
   a first dedicated terminal external to the semiconductor device package, wherein the first dedicated terminal is electronically coupled to the first integrated circuit via a trace formed on the second integrated circuit.

2. The system of claim 1, wherein the trace formed on the second integrated circuit does not couple the buffer of the second integrated circuit to first dedicated terminal.

3. The system of claim 1, wherein the first dedicated terminal to receive a test signal, the test signal to cause the first integrated circuit to operate in the test mode.

4. The system of claim 1, further comprising:
   a second terminal external to the semiconductor device package, wherein the second terminal is electronically coupled to the first integrated circuit and to the buffer in the second integrated circuit.

5. The system of claim 1, wherein the buffer comprises at least one of a normal mode buffer or a test mode buffer.

6. The system of claim 5, further comprising:
   a third terminal to receive a signal to activate one of the normal mode buffer or the test mode buffer, wherein only one of the normal mode buffer and the test mode buffer is activated at one time.

7. The system of claim 1, wherein the memory device comprises a latch and a fuse, the latch to receive fuse configuration data and to output a soft-blow signal based on the fuse configuration data, and the soft-blow signal to configure the fuse.

8. A method comprising:
receiving a first signal at a first dedicated terminal external to a semiconductor package, the semiconductor package comprising a first integrated circuit configured to operate in at least a normal mode and a test mode and a second integrated circuit comprising a buffer, wherein the first integrated circuit comprises a memory device and wherein the second integrated circuit comprises a memory controller; and
conveying the signal from the first dedicated terminal to or from the first integrated circuit via a trace formed on the second integrated circuit.

9. The method of claim 8, wherein the trace formed on the second integrated circuit does not couple the buffer of the second integrated circuit to first dedicated terminal.

10. The method of claim 8, further comprising:
receiving, at the first dedicated terminal, a test signal to cause the first integrated circuit to operate in the test mode.

11. The method of claim 8, further comprising:
receiving a second signal at a second terminal external to the semiconductor package, wherein the second terminal is electronically coupled to the first integrated circuit and to the buffer in the second integrated circuit.

12. The method of claim 8, wherein the buffer comprises at least one of a normal mode buffer or a test mode buffer.

13. The method of claim 12, further comprising:
receiving a third signal, the signal to activate one of the normal mode buffer or the test mode buffer, wherein only one of the normal mode buffer and the test mode buffer is activated at one time.

14. The method of claim 8, wherein the memory device comprises a latch and a fuse, the latch to receive fuse configuration data and to output a soft-blow signal based on the fuse configuration data, and the soft-blow signal to configure the fuse.

15. A system comprising:
a logic device configured to operate in at least a normal mode and a test mode, wherein the logic device comprises a memory device;
an integrated circuit comprising a buffer, wherein the integrated circuit comprises a memory controller, both the logic device and the integrated circuit being disposed within the same semiconductor device package; and
a first dedicated terminal external to the semiconductor device package, wherein the first dedicated terminal is electronically coupled to the logic device via a trace formed on the integrated circuit.

16. The system of claim 15, wherein the trace formed on the integrated circuit does not couple the buffer of the integrated circuit to first dedicated terminal.

17. The system of claim 15, wherein the first dedicated terminal to receive a test signal, the test signal to cause the logic device to operate in the test mode.

18. The system of claim 15, further comprising:
a second terminal external to the semiconductor device package, wherein the second terminal is electronically coupled to the logic device and to the buffer in the integrated circuit.

19. The system of claim 15, wherein the buffer comprises one of a normal mode buffer or a test mode buffer, the system further comprising:
a third terminal to receive a signal to activate one of the normal mode buffer and the test mode buffer, wherein only one of the normal mode buffer and the test mode buffer is activated at one time.

20. The system of claim 15, wherein the memory device comprises a latch array and a fuse array, the latch array to receive fuse configuration data and to output a soft-blow signal based on the fuse configuration data, and the soft-blow signal to configure the fuse array.

* * * * *